US012187622B2

(12) United States Patent
Chu et al.

(10) Patent No.: US 12,187,622 B2
(45) Date of Patent: Jan. 7, 2025

(54) RRAM MATERIALS AND DEVICES

(71) Applicant: Australian Advanced Materials Pty Ltd, Western (AU)

(72) Inventors: Dewei Chu, Killara (AU); Tao Wan, Kingsford (AU); Sean Suixiang Li, Turramurra (AU)

(73) Assignee: Australian Advanced Materials Pty Ltd, Subiaco (AU)

(*) Notice: Subject to any disclaimer, the term of this patent is extended or adjusted under 35 U.S.C. 154(b) by 0 days.

(21) Appl. No.: 17/624,133

(22) PCT Filed: Jul. 3, 2020

(86) PCT No.: PCT/AU2020/050700

§ 371 (c)(1),
(2) Date: Sep. 29, 2022

(87) PCT Pub. No.: WO2021/000022

PCT Pub. Date: Jan. 7, 2021

(65) Prior Publication Data

US 2023/0048493 A1 Feb. 16, 2023

(30) Foreign Application Priority Data

Jul. 4, 2019 (GB) ..................................... 1909658

(51) Int. Cl.

| | |
|---|---|
| ***C01G 23/00*** | (2006.01) |
| ***C09D 1/00*** | (2006.01) |
| ***C09D 5/24*** | (2006.01) |
| ***H01B 1/08*** | (2006.01) |
| ***H10N 70/00*** | (2023.01) |

(52) U.S. Cl.
CPC ............. *C01G 23/006* (2013.01); *C09D 1/00* (2013.01); *C09D 5/24* (2013.01); *H01B 1/08* (2013.01); *H10N 70/8836* (2023.02)

(58) Field of Classification Search
CPC ........... H01B 1/08; C01G 23/006; C09D 5/24
See application file for complete search history.

(56) References Cited

U.S. PATENT DOCUMENTS 9,409,789 B2 * 8/2016 Yoon .................... C01G 23/006
2007/0254154 A1 * 11/2007 Wong ................ C04B 35/62873 428/401

FOREIGN PATENT DOCUMENTS

| | | | |
|---|---|---|---|
| EP | 2883839 | * | 6/2015 |
| JP | 2011068500 | | 4/2011 |
| WO | 2018/102876 A1 | | 6/2018 |

OTHER PUBLICATIONS

Rabuffetti et al "Synthesis-Dependent First-Order Raman Scattering in SrTiO3 Nanocubes at Room Temperature", Chem. Mater. 2008, 20, 5628-5635.*

(Continued)

*Primary Examiner* — Mark Kopec
(74) *Attorney, Agent, or Firm* — Barclay Damon LLP

(57) ABSTRACT

Methods for the manufacture of stable strontium titanate nanocube sols are disclosed. The sols are useful in the manufacture of switchable layers suitable for RRAM applications and the switching performance is stable and reproducible. The RRAM layers comprise a mixture of strontium titanate nanocubes and surfactant.

20 Claims, 17 Drawing Sheets b) 50 nm

(56) References Cited

OTHER PUBLICATIONS

Canu et al "Hydrothermal synthesis of strontium titanate: thermodynamic considerations, morphology control and crystallisation mechanisms", CrystEngComm, 2017, 19, 3867.*

Hao et al "Highly dispersed SrTiO3 nanocubes from a rapid sol-precipitation method", Nanoscale, 2014, 6, 7940.*

Koczkur et al "Polyvinylpyrrolidone (PVP) in nanoparticle synthesis", Dalton Trans., 2015, 44, 17883.*

Song et al "Investigation on the role of the molecular weight of polyvinyl pyrrolidone in the shape control of high-yield silver nanospheres and nanowires", Nanoscale Research Letters 2014, 9:17.*

Guan, P. "Development of Transparent and Flexible Resistive Switching Materials", Master Degree Thesis, School of Materials & Engineering, 157 pages, Jul. 20, 2018.

Triveno, G. B., "Multifunctionality of SrTiO3 nanocubes", Doctor of Philosophy (PhD) Degree Thesis, School of Materials Science & Engineering, Faculty of Science, UNSW Australia, Nov. 2017, pp. I-XVIII and 1-178.

Lin, X., "Synthesis and Characterization of Self-assembled Perovskite Oxide Nanocubes for Resistive Random Access Memory Applications", Master Degree Thesis, School of Materials Science & Engineering, Faculty of Science, UNSW Australia, May 2013, 87 pages.

Hao et al., "Highly Dispersed SrTiO3 Nanocubes from a Rapid Sol-Precipitation Method", Nanoscale, 2014, vol. 6, pp. 7940-7946.

Dang et al., "Growth of Monodispersed SrTiO3 Nanocubes by Thermohydrolysis Method", CrystEngComm., 2011, vol. 13, pp. 3878-3883.

Harrigan et al., "Tunable Electronic Structure and Surface Defects in Chromium Doped Colloidal SrTiO3-δ Nanocrystals", Chem. Mater., 2016, vol. 28, pp. 430-433.

Zhu et al., "High-Yield Synthesis of Uniform Ag Nanowires with High Aspect Ratios by Introducing the Long-Chain PVP in an Improved Polyol Process", Journal of Nanomaterials, 2011, pp. 1-7.

International Searching Authority—International Search Report, pertaining to International Application No. PCT/AU2020/050700, dated Aug. 28, 2020, together with the Written Opinion of the International Searching Authority, 11 pages.

* cited by examiner

RRAM MATERIALS AND DEVICES

FIELD OF INVENTION

The present invention is concerned with the synthesis of strontium titanate materials and their use in the manufacture of electronic devices. In particular the present invention is concerned with the preparation of useful strontium titanate sols that may be used in the manufacture of particulate material layer structures for resistive-switching memories and to resistive-switching memory devices also known as Resistive RAM or RRAM comprising these particulate material layers structures.

BACKGROUND ART

Non-volatile memories are memories that retain their contents when unpowered. They may be used for storage in a wide variety of devices that require persistent data storage. These non-volatile memories may often take the form of removable and portable memory cards or other memory modules. They may also be integrated into other types of circuits or devices. Non-volatile semiconductor memories are receiving increasing attention because of their advantages in being small in size, exhibiting data persistence, having no moving parts and their need for little power for operation.

Resistive-switching memories are typically memory devices that include a resistive-switching material (e.g. a metal oxide) that changes from a first resistivity to a second resistivity upon the application of a set voltage, and from the second resistivity back to the first resistivity upon the application of a reset voltage. Resistive Random Access Memory (often abbreviated to ReRAM or RRAM) is emerging as one of the most promising technologies for non-volatile memory. These types of memory are often characterized by their simple structure, high operation speed, low power consumption, feasibility of vertical stacking and good compatibility with the current complementary metal oxide semiconductor (CMOS) technology and related technologies.

Recent developments in the manufacture of metal oxide-based RRAM technologies have focused on the use of what is termed a bottom up approach. In this approach the metal oxide layers of the RRAM are manufactured using particulate metal oxides in the form of dispersions or inks that are coated or printed upon suitable substrates and thus afford the possibility of low cost printed memory technology. A key challenge with this approach is the development of suitable particulate metal oxide or similar materials for the manufacture of these RRAM layers, suitable coating dispersions or inks that from such materials and high-quality deposited layers. One promising area is the preparation and use of metal oxide nanocubes in the form of dispersions or inks for the manufacture of metal oxide RRAM layers.

One set of materials of interest are strontium titanate based nanocube materials. A number of synthetic methods have been devised for their synthesis. However, all of these methods have certain limitations in that they either provide strontium titanate dispersions or sols that are not suitable for further deposition techniques i.e. are unstable and/or when used for depositing metal oxide layers provide layers that are unsuitable for use in RRAM applications, or provide poor quality RRAM layers. In addition, many of these approaches use raw materials i.e. hydrazine, that are difficult and hazardous to handle on a commercial scale or which result in the introduction of contamination of the final RRAM layer with impurities or components that are undesirable from a performance or other perspectives.

In general, the synthesis of strontium titanate nanocubes by many methods is problematic in terms of control and consistency of the final sol or quality of the isolated nanocubes or quality of deposited coatings. Many synthetic methods are prone to the effects of minor variations in raw materials, levels of materials and reaction conditions and this makes it difficult to provide strontium titanate nanocubes on any scale that is suitable for commercial use especially for the demanding application in RRAM.

Strontium titanate nanocubes have been prepared using a rapid sol-precipitation method. One such method is described in a paper by Yanan Hao, et. al.

(Highly dispersed SrTiO3 nanocubes from rapid sol-precipitation method, Nanoscale, 2014, 6, 7940). The materials in this paper were used as photocatalysts but have been found to be unsuitable for RRAM use.

There is therefore a continuing need for suitable synthetic routes to strontium titanate nanocubes, for the production of stable and useful dispersions or inks of strontium titanates and for the production of high-quality material layers in RRAM devices from strontium titanate based materials.

DISCLOSURE OF THE INVENTION

In the present invention it has been found that stable and useful strontium titanate sols may be manufactured via new hydrothermal sol-precipitation methods under atmospheric pressure. These methods result in sols that provide stable and useful dispersions and inks, which in turn have been found to provide high quality RRAM layers that have good performance and may be reproducible in high yield.

In a first aspect the present invention provides a method for the synthesis of a strontium titanate nanocube dispersion, which method comprises preparing a mixture comprising a source of strontium, a source of titanium, a source of hydroxyl, a surfactant and organic solvent, heating of the mixture under ambient pressure with stirring to a temperature and for a time sufficient to induce hydrolysis and formation of dispersed strontium titanate nanocubes, wherein the surfactant has a molecular weight of greater than 80,000 $g \cdot mol^{-1}$.

Preferably, the surfactant has a molecular weight of between 80,000 $g \cdot mol^{-1}$ and 400,000 $g \cdot mol^{-1}$, more preferably between 100,000 $g \cdot mol^{-1}$ and 400,000 $g \cdot mol^{-1}$, more preferably between 200,000 $g \cdot mol^{-1}$ and 400,000 $g \cdot mol^{-1}$ and most preferably between 300,000 $g \cdot mol^{-1}$ and 400,000 $g \cdot mol^{-1}$. The surfactant is preferably a polymeric organic compound, preferably a heteroatom containing hydrocarbon polymer and most preferably a nitrogen containing polymeric organic compound. Examples of suitable polymers as surfactants include; polyvinyl alcohols (PVA), polyethylene glycols (PEG), polypropylene glycols (PPG), polyacrylic acids (PAA), polyvinyl butyrate (PVB), polyphenylene oxides (PPO) and polyvinyl pyrrolidone (PVP). The preferred surfactants are polymeric materials derived at in least part from the polymerization and/or co-polymerization of N-vinyl pyrrolidone; the preferred polymeric surfactants are polyvinyl pyrrolidones. This resulting nanocube dispersions may be used as synthesized or with suitable dilution with a solvent, as an ink for the manufacture of high-quality RRAM layers. The synthesis solution comprising strontium titanate nanocubes prepared by the methods of the present invention are hydrazine free and stable in that they are formed without precipitation.

In a second aspect the present invention provides a method for the synthesis of a strontium titanate nanocube dispersion, which method comprises preparing a synthesis mixture comprising a source of strontium, a source of titanium, a source of hydroxyl, a surfactant and organic solvent, and heating of the mixture under ambient pressure with stirring to a temperature and for a time sufficient to induce hydrolysis and formation of dispersed strontium titanate nanocubes, wherein the source of base is added to the mixture of other components dropwise with stirring before commencement of thermal hydrolysis.

Preferably the source of hydroxyl is not an organic source. Preferably, the source of hydroxyl is not tetramethylammonium hydroxide. A preferred source of hydroxyl is $NH_4OH$. Preferably, the $NH_4OH$ is added as a 25-35% by weight mixture in water. The rate of addition is from 2 to 10 $ml \cdot min^{-1}$, preferably from 3 to 8 $ml \cdot min^{-1}$, most preferably from 3 to 7 $ml \cdot min^{-1}$, and most preferably about 5 $ml \cdot min^{-1}$. The $NH_4OH$ is preferably injected drop by drop under stirring to achieve a homogeneous mixture. The relatively fast addition rate is used to avoid the unwanted evaporation of $NH_4OH$ during the addition process.

In a third aspect the present invention provides a method for the synthesis of a strontium titanate nanocubes, which method comprises preparing a mixture comprising a source of strontium, a source of titanium, a source of hydroxyl, a surfactant and organic solvent, and heating of the mixture under ambient pressure with stirring to a temperature and for a time sufficient to induce hydrolysis and formation of dispersed strontium titanate nanocubes, wherein the mixture is heated up to a temperature of between 150 and 200° C. over a period of greater than two hours. Preferably, it is heated up to a temperature of 160° C. Preferably, it is heated up to the desired temperature over a period of three hours or greater and preferably four hours or greater. Preferably, the reactor comprising the synthesis mixture is placed in a pre-heated oven at between 150 and 200° C. and is reacted at a temperature within this range for a period of greater than two hours with stirring.

Preferred solvents are oxygenated solvents, which are organic solvents comprising carbon hydrogen and oxygen. Suitable examples of oxygenated solvents include alcohols, glycol ethers, methyl acetate, ethyl acetate, ketones, esters, and glycol ether/esters. The most preferred solvents are glycols of ethylene or propylene and most preferably ethylene. Suitable solvents include the glycol ether solvents such as ethylene glycol monomethyl ether (2-methoxyethanol, $CH_3OCH_2CH_2OH$), ethylene glycol monoethyl ether (2-ethoxyethanol, $CH_3CH_2OCH_2CH_2OH$), ethylene glycol monopropyl ether (2-propoxyethanol, $CH_3CH_2CH_2OCH_2CH_2OH$), ethylene glycol monoisopropyl ether (2-isopropoxyethanol, $(CH_3)_2CHOCH_2CH_2OH$), ethylene glycol monobutyl ether (2-butoxyethanol, $CH_3CH_2CH_2CH_2OCH_2CH_2OH$), ethylene glycol monophenyl ether (2-phenoxyethanol, $C_6H_5OCH_2CH_2OH$), ethylene glycol monobenzyl ether (2-benzyloxyethanol, $C_6H_5CH_2OCH_2CH_2OH$), propylene glycol methyl ether, (1-methoxy-2-propanol, $CH_3OCH_2CH(OH)CH_3$) diethylene glycol monomethyl ether (2-(2-methoxyethoxy)ethanol, methyl carbitol, $CH_3OCH_2CH_2OCH_2CH_2OH$), diethylene glycol monoethyl ether (2-(2-ethoxyethoxy)ethanol, carbitol cellosolve, $CH_3CH_2OCH_2CH_2OCH_2CH_2OH$), diethylene glycol mono-n-butyl ether (2-(2-butoxyethoxy)ethanol, butyl carbitol, $CH_3CH_2CH_2CH_2OCH_2CH_2OCH_2CH_2OH$), and dipropyleneglycol methyl ether. Other suitable solvents include the dialkly ethers such as ethylene glycol dimethyl ether (dimethoxyethane, $CH_3OCH_2CH_2OCH_3$), ethylene glycol diethyl ether (diethoxyethane, $CH_3CH_2OCH_2CH_2OCH_2CH_3$), and ethylene glycol dibutyl ether (dibutoxyethane, $CH_3CH_2CH_2CH_2OCH_2CH_2OCH_2CH_2CH_2CH_3$). Other suitable solvents include glycol esters such as ethylene glycol methyl ether acetate (2-methoxyethyl acetate, $CH_3OCH_2CH_2OCOCH_3$) ethylene glycol monoethyl ether acetate (2-ethoxyethyl acetate, $CH_3CH_2OCH_2CH_2OCOCH_3$), ethylene glycol monobutyl ether acetate (2-butoxyethyl acetate, $CH_3CH_2CH_2CH_2OCH_2CH_2OCOCH_3$), and propylene glycol methyl ether acetate (1-methoxy-2-propanol acetate). The most preferred solvents are di-ethylene glycol and it's derivatives and tri-ethylene glycol (TEG) and its derivatives such as tri-ethylene glycol monomethylether.

Preferably, with respect to all aspects the hydrothermal reaction is terminated through the removal of the source of heat and the subsequent gradual reduction in the temperature of the reaction mixture under exposure to ambient conditions i.e. air cooled.

In a further aspect the present invention provides a method for the synthesis of a strontium titanate nanocube dispersion, which method comprises any combination of any two or more of the methods for the synthesis of dispersions of strontium titanate nanocubes of the first, second and third aspects.

In all the methods of synthesis of strontium titanate nanocubes of the present invention it is preferred that the mole ratio of strontium to titanium in the reaction is within the range of 0.8:1 to 1:0.8.

In a preferred embodiment of the methods for the synthesis of a strontium titanate nanocubes provided in the first, second, third and further aspects the process is undertaken with two distinct thermal stages and/or a controlled order of addition of components for the synthesis. By thermal stage is mean a process step that is undertaken at a temperature elevated above ambient temperature and typically means a temperature of greater than 25° C. and preferably greater than 35° C. The first thermal stage is referred to as the reaction preparation stage and the second thermal stage is referred to as the hydrolysis reaction stage. The reaction mixture preparation stage is preferably carried out at an elevated temperature above ambient but below a temperature that will induce significant hydrolysis. Thus, it is preferred that the reaction mixture is prepared at a temperature of from 40 to 140° C., and more preferably a temperature from 50 to 100° C. Typically, the reaction mixture is prepared by first heating the organic solvent e.g. TEG in a reaction vessel to a desired mixture preparation temperature and then the components for the hydrolysis reaction are added in sequence to the vessel at this mixture preparation temperature. As a first step it is preferred that the surfactant e.g. PVP is first dissolved in the heated organic solvent with stirring before the addition of other components. It is then preferred that the strontium precursor is added to the surfactant solvent mixture at this temperature before the addition of any dopant precursor and before the addition of the titanium containing precursor. Finally, when the mixture is homogeneous, the source of hydroxyl e.g. $NH_4OH$ is added with stirring at this first stage temperature. Once this reaction mixture preparation stage is completed the temperature of the reaction mixture is then raised to the higher temperatures needed to induce the hydrolysis reaction.

The product of the methods of the present invention is a dispersion comprising doped or undoped strontium titanate nanocubes with a surfactant of molecular weight of greater than 80,000 $g \cdot mol^1$ in a liquid organic solvent medium. This may be referred to as a sol or an as synthesized dispersion of doped or undoped strontium titanate nanocubes. Further materials e.g. other solvents or additives may be added to this sol or dispersion for subsequent use of the sol or dispersion in coating or printing operations. Alternatively, or on addition various components of the as synthesized sol or dispersion, such as impurities or organic components may be removed through further processing such as evaporation, filtering, solvent extraction or centrifugation. Alternatively, the sol or as synthesized dispersion may be used directly as an ink or coating solution, without further significant modification other than dilution with a suitable organic solvent.

In a further aspect the present invention provides a strontium titanate nanocube dispersion comprising strontium titanate nanocubes, organic solvent and surfactant of a molecular weight of greater than 80,000 $g \cdot mol^{-1}$. Preferably, the dispersion comprises one or more surfactants as hereinbefore defined and most preferably a polyvinyl pyrrolidone (PVP) as surfactant and a glycol-based solvent. Preferably, the as synthesized dispersion comprises from 1 to 10% by weight of strontium titanate in the form of nanocubes, more preferably from 1 to 8% by weight, more preferably 1.25 to 6% by weight, more preferably from 1.25 to 6% by weight, and most preferably from 1.5 to 5.0% by weight. Preferably, the as synthesized dispersion comprises from 0.1 to 5% by weight of surfactant(s), more preferably from 0.1 to 4% by weight, more preferably 0.2 to 3% by weight and most preferably from 0.5 to 2.0% by weight. The balance of the materials in the dispersion is mainly glycol solvent, which is present within the range of 50 to 85% by weight, more preferably 55 to 80% by weight, and most preferably 60 to 75% by weight, and other reactant components such as base and water. Starting from these as synthesized proportions lower proportions mat be present of the as synthesized dispersion is further diluted with a suitable solvent in preparing an ink or coating composition for printing or coating e.g. by slot die coating. As an example, if the key raw materials in the synthesis are completely converted to strontium titanate (STO) nanocubes, the mass ratio of STO in the synthesized sol is about 4.5%, PVP is about 1.1%, and glycol is about 68%. If this sol is then diluted with ethanol to form an ink with a mass ratio of as synthesized dispersion: ethanol of 1:1, then STO is about 2.25%, PVP is about 0.55%, glycol is about 34%.

In a further aspect the present invention provides a strontium titanate nanocube dispersion as prepared by any of the aspects disclosed herein.

The as synthesized strontium nanocube sols or dispersions may be used as inks or coating solutions for the manufacture of strontium titanate nanocube layers such as RRAM layers. In a preferred embodiment the as synthesized strontium nanocube dispersion is further diluted with one or more solvents to provide a formulated ink or coating dispersion. Preferably, the ink or coating dispersion comprises the addition of one or more organic solvents and most preferably one or more oxygenated solvents as hereinbefore defined. Preferably, at least one of the solvents is an alcohol and most preferably is ethanol or a glycol derivative.

Preferably, the ink or coating dispersion is prepared by dilution of the as synthesized dispersion with the desired solvent(s) to achieve the desired rheology for the ink or coating dispersion depending on the printing or coating technique to be used. Preferably the dilution is at a weight ratio of solvent:sol dispersion within the range of from 0.5:2.0 to 2.0:0.5, more preferably 0.75:1.5 to 1.5:0.75 and most preferably 0.8:1.4 to 1.4:0.8. The ratio of solvent:sol dispersion typically in the range of 1.2:10 to 1:1.2 solvent: sol. This ratio may be adjusted to enable better control of deposited film thickness when the ink or coating dispersion is used to deposit a film. The resultant formulated dispersions or inks preferably comprise between 0.5 and 1.5% by weight of strontium titanate in the form of nanocubes, more preferably between 0.625 and 1.25 by weight, and most preferably 0.75 and 1.0% by weight.

The resultant as synthesised dispersions, formulated coating dispersions and inks according to the present invention are stable. By stable is meant that they do not show signs of precipitation, agglomeration or sedimentation after relatively prolonged periods of storage. Such as for example one day or more, more preferably one week or more, more preferably one month or more and most preferably six months or more of storage sealed. In the case of as synthesized dispersions these levels of stability were achieved through refrigeration for more than 6 months. For the diluted ink, it may be stored under ambient conditions and is stable for several weeks or more.

In a further aspect of the present invention the dispersed as synthesized strontium titanate nanocubes are isolated from their dispersion through precipitation from the as synthesized dispersions. In a preferred embodiment precipitation is induced through the addition of water to the sol. In a preferred embodiment the weight ratio of water:sol used is greater than 30:1, more preferably greater than 40:1 and most preferably 50:1 or greater.

After addition of enough water to the strontium titanate nanocube dispersion, strontium titanate nanocubes are precipitated onto the bottom of the container. The complete precipitation process normally takes several hours or days. Finally, the precipitated nanocubes are separated after removal of the supernatant, preferably through high speed centrifugation and typically at 15,000 rpm. The separated nanocubes are preferably washed with water, a water/alcohol mixture or alcohol; preferably the alcohol is ethanol. The washing process is preferably repeated to ensure that as much residual organic material as possible is removed from the nanocubes. Typically, this requires at least four washing steps and preferably with a final alcohol only washing step. The washed nanocubes may then be dried at ambient temperature for 24 hours. The nanocubes of the present invention will still retain bonded surfactant on their surfaces after extensive washing and the present invention provides for strontium titanate nanocubes comprising surface bonded surfactant of molecular weight of greater than 80,000 $g \cdot mol^{-1}$.

In a further aspect the isolated nanocubes may be used to formulate inks or coating dispersions. The isolated and preferably washed nanocubes may be re-dispersed into a suitable solvent or solvent mixture with or without further additives such as for example surfactants or dispersing aids. In this embodiment the level and nature of organic materials present in the layer of deposited strontium titanate nanocubes may be controlled to aid further processing of the deposited layer. As an example organic solvents and/or dispersants or surfactants may be used that may be removed through relatively low temperature processing of the deposited layer; for example solvents and/or surfactants that decompose or are removed at temperatures below 200° C. and especially 160° C. allow memory devices to be manufactured on temperature sensitive materials such as plastics and organic polymeric substrates. The nanocubes may be isolated from the reaction mixture supernatant and used, without further washing or treatment, to formulate inks or coating dispersions. The post deposition thermal processing of the strontium titanate layers may fall into three types. The first is where materials in the coated layer are removed through the action of heat and evaporation; as is typical with solvents or compounds of low volatility. The second is where materials are removed from the deposited strontium titanate layers through the action of heat and where the compounds in the layer are denatured by the action of heat and/or may be oxidized in the presence of oxygen; under these conditions, which are typically at higher temperatures than mere evaporation conditions materials that do not evaporate may be removed from the layer; this is typically an annealing stage. A final thermal process is where the inorganic particles within the layer are thermally conditioned to change the properties of the layer; this thermal conditioning may in part result in changes of form or composition of the inorganic layers. All three types of thermal processing may be used in the process of the present invention for RRAM layer preparation. It is preferred however that in the process of the present invention only the first type of thermal processing is utilized and that volatile components are removed from the layer but that non-volatile components, and in particular the surfactant(s), are retained unaltered in the RRAM layer. It is possible that all of these processes may occur at the same time given the nature of the materials in the layer and the temperature used.

The strontium titanate inks or dispersions of the present invention may be used to manufacture dope or undoped strontium titanate nanocube layers and these layers may be used as memory structures e.g. RRAM in electronic devices.

The present invention further provides a method for the manufacture of a strontium titanate nanocube layer, which method comprises depositing an as synthesized sol or dispersion or formulated coating dispersion or printing ink of strontium titanate nanocubes according to the present invention onto a suitable substrate with drying of the deposited or printed strontium titanate nanocube layer. In this method the formulated coating dispersion or ink may be formulated from the as synthesized sol or from isolated nanocubes that have been redispersed. Preferably, no further type of thermal processing of the later is used in this method other than evaporation.

The strontium titanate inks or dispersions of the present invention may be used to deposit a single layer of strontium titanate nanocubes or typically for memory structures of the present invention are deposited to form multiple layers to achieved a desired thickness and thus the final coating comprises layers of strontium titanate nanocubes fabricated by forming layers adjacent to the previous layer. Typically, in order to form a layer of self-assembled strontium titanate nanocube on an electrode, or on a previous layer or a substrate, a stable dispersion is prepared by dispersing the nanocubes in a liquid medium that is capable of dispersing the nanocubes or preferably by mixing the as synthesized sol of strontium titanate nanocube with one or more solvents. The liquid medium can be prepared from any suitable liquid, e.g. from a solvent or a mixture of solvents. Advantageously, a stable dispersion can facilitate the self-assembly of the nanocubes and the sols of the present invention are relatively stable. In some embodiments, the liquid medium is an organic solvent or a mixture of organic solvents. The organic solvent may, for example, be toluene, ethanol or n-hexane. In preferred embodiments, the organic solvent is ethanol and/or glycol derivatives such as tri-ethylene glycol. In some embodiments, the dispersion is an ink, e.g. a printable ink that may be printed using a variety of printing techniques and especially inkjet printing. In one embodiment, the dispersion is a coating dispersion that can be used by solution processed techniques (e.g. dip coating, spin coating, spray coating, or slot die coating) to form the memory structure. Modifications to the rheological, solubility and wettability properties of the dispersion can be made to suit a particular solution processed technique. For example, in inkjet printing, jetting characteristics can be adjusted by the addition of a surfactant and/or solvent (e.g. toluene, ethanol or n-hexane) to the dispersion.

A range of solution and dispersion-based methods may be used for depositing a strontium titanate nanocube coating onto a substrate for use in a memory structure of the present invention. These solution or dispersion processes include such techniques as spin coating, spray coating, dip coating, drop coating, slot die coating, nanoimprint, ink-jet printing, spray printing, intaglio printing, screen printing, flexographic printing, offset printing, stamp printing, gravure printing and aerosol jet.

One way of depositing a particulate metal oxide layer in the present invention is through the drop-coating method. The drop-coating method involves putting one or two drops of a dispersion of nanocubes (typically one drop is equivalent to about 100 μL) onto an electrode. Typically, the layer is allowed to dry naturally and may then be annealed.

Another fabrication method is the use of spin coating techniques to deposit layers of self-assembled strontium titanate nanocubes. A small amount of the dispersion is put onto the electrode or previously deposited layer. The substrate is then rotated at high speed in order to spread the coating material by centrifugal force. Rotation is continued while some of the dispersion spins off the edges of the substrate, until the desired thickness of the film is formed by the residual dispersion. Typically, the layer is allowed to dry naturally and then annealed. Thin and uniform layers may be produced by the spin coating method. Typically, the spin coating is operated at between 1000 to 4000 rpm for 20 to 60 seconds.

With reference to all embodiments of the present invention it is preferred that all of the material layers comprising the resistive switching material are deposited by means of a liquid printing or coating process.

The preferred method for the manufacture of a strontium titanate nanocube layer according to the present invention comprises a spin coating process or a slot die deposition process. Preferably, spin coating at 1000 to 4000 rpm for 20 to 40 seconds.

Preferably, the method for the manufacture of a strontium titanate nanocube layer comprises solvent evaporation after deposition. Preferably, solvent evaporation is in an oven at a temperature between 70 to 300° C., more preferably 70 to 280° C., more preferably 100 to 200° C., more preferably 100 to 180° C., and most preferably at a temperature from 100 to 160° C., for sufficient time to ensure complete evaporation of solvents aqueous or non-aqueous from the layer. Typically, at 100 to 160° C. for 30 minutes to 1 hour. Preferably, no further thermal processing is used after this evaporation stage. In a further embodiment the substrate comprising the strontium titanate nanocube layer may be exposed to a further thermal treatment after the evaporation stage. Preferably, this thermal treatment is undertaken at a temperature of from 150 to 500° C., more preferably from 150 to 450° C. In a preferred embodiment the thermal treatment is carried out at 450° C. for 1 hour, with the sample being heated at 5° C./min to 450° C. This may be termed a thermal annealing treatment. After the annealing is completed the sample is allowed to cool to ambient conditions. In this annealing process non-evaporative organic components of the strontium titanate layer may be removed e.g. residual PVP surfactant.

In a preferred embodiment after deposition of the strontium titanate nanocubes, the resulting layer is subjected to a drying stage and is not subjected to a high temperature annealing stage. In this embodiment the resulting layer for electrode deposition will comprise strontium titanate nanocubes and residual components of the synthesis mixture and/or additives used for ink or coating formulation that are not evaporated under solvent evaporation conditions. Thus, in a preferred embodiment the strontium titanate nanocube layer further comprises one or more surfactants of molecular weight of greater than 80,000 $g \cdot mol^{-1}$. Thus the present invention further provides for a strontium titanate layer comprising strontium titanate nanocubes and one or more surfactants of molecular weight of greater than 80,000 $g \cdot mol^{-1}$. Preferably the layer comprises from 75 to 95 weight % of strontium titanate and from 5 to 25 weight of surfactant; there may be minor amounts of other components present after the thermal evaporation stage.

Preferably, the substrate for printing or coating is glass (FTO) or glass (ITO) or plastic or silicon and most preferably is a plastic substrate.

With spin coating it is preferred that when the dispersion is deposited onto the desired substrate that it is left in contact with the substrate surface for a period of time before spinning of the substrate is commenced. Typically, this is enough time to allow the deposited dispersion to wet the surface of the substrate and in the case of strontium titanate nanocube dispersions is typically at least 10 seconds, preferably at least 20 seconds, more preferably 40 seconds and most preferably at least 60 seconds. In one embodiment the substrate, after this wetting phase, may be immediately spun at a desired speed e.g. 4000 rpm for the desired period e.g. 30 seconds, to obtain the desired thickness of coating on the substrate.

In addition, the spin coating may be undertaken in a specific sequence of stages. The first is the dispersion deposition stage where there is no rotation and the substrate is simply wetted by the coating dispersion. The second stage is a relatively low speed spinning stage to spread the dispersion over the whole surface of the substrate; typically this is from 300 to 500 rpm at a rate of 500 $rpm \cdot s^{-1}$ for a short period of 2 to 10 seconds, preferably 2 to 8 seconds and typically 5 seconds. A third stage is a high speed spin at typically 1000 to 4000 rpm at a rate of 1000 $rpm \cdot s^{-1}$ for 10 to 40 seconds, preferably 20 to 40 seconds and most preferably 30 seconds This is then followed by a final drying spin at typically 500 to 1000 rpm at a rate of 500 $rpm \cdot s^{-1}$ for 10 seconds. Typically, prior to high temperature drying the edges of the substrate are cleared of coating material to expose electrode contact surfaces. It is preferred that the sol or in/coating solution is stored under refrigerated conditions, preferably less than 5° C., prior to use for deposition. Before the film preparation, the stored diluted sol is preferably given an ultrasonic treatment for 5~10 minutes.

In a preferred embodiment the sol or ink/coating solution is filtered as it is deposited or printed. Preferably it is sonicated before use when removed from refrigeration and the filter is 0.2 to 0.6 μm PTFE.

In the present invention it us preferred that the ink or coating dispersion formulation and the spin coating operations are optimized to ensure that the final deposited layer thickness of strontium titanate nanocubes after forced drying is at least 80 nm and preferably 100 nm or more and preferably within the range of 80 to 400 nm, more preferably 80 to 300 nm, more preferably 100 to 300 nm, and most preferably 100 to 160 nm.

The present invention in a further aspect provides a supported layer comprising strontium titanate nanocubes according to the present invention. The layer is preferably self-assembled. The layer is preferably a layer of close packed nanocubes. The layer may further comprise surfactant and/or surfactant residue. The layer may further comprise glycol solvent or glycol solvent residue. The layer may further comprise carbonaceous residues from the surfactant and/or solvents as a result of any high temperature annealing process on the deposited layer.

These supported layers may be used as RRAM layers and thus the present invention further provides an electronics device, preferably a memory device comprising one or more deposited and/or printed layers comprising strontium titanate nanocubes according to the present invention and preferably surfactant. In a preferred embodiment the device is a RRAM.

Therefore the present invention in a further aspect provides a resistive-switching memory unit comprising a first electrode, a second electrode and resistive switching material located between the first and second electrodes and wherein the resistive switching material comprises strontium titanate nanocubes according to the present invention and the resistive-switching memory unit has at least one low (LRS) and one high (HRS) resistance state. Preferably the ratio of HRS/LRS is greater than 100 more preferably greater than 120 and most preferably greater than 150.

The present invention further provides a resistive-switching memory unit comprising a first electrode, a second electrode and resistive switching material located between the first and second electrodes and wherein the resistive switching material comprises strontium titanate nanocubes and the resistive-switching memory unit has a switch voltage of 2 volts or less. Preferably 1.5 volt or less. Preferably, within the range of 0.5-1.5 volts and preferably 0.5 to 1.2 volts. Such low switching voltages provide memory devices with low levels of power consumption for their operation.

The memory units of the present invention will therefore typically during use have a minimum of two resistive states; namely a High Resistive State (HRS) and a Low Resistive State (LRS). VSET and VRESET voltages are used to switch between HRS and LRS. Appropriate circuitry and electronics are used to detect the resistive state of the memory unit and to switch between HRS and LRS. During use the state of the memory (HRS or LRS) may be determined through use of a sensing voltage VSENSE. The resistive state namely HRS or LRS is selected to be logic one and logic zero to provide a 1-bit device. If there are multiple resistive states other than HRS and LRS then the device may be operated as 2 or higher bit devices depending on the number of resistive states present in the memory unit. Once the resistive state has been determined at the read stage a write operation can be instigated to induce a change of resistive state in the memory unit using either the VSET or VRESET voltage. The resistive state selected is stable after application of VSET or VRESET and so is in essence is a non-volatile memory unit. It is desirable that the resistance gap between HRS and LRS are is such that they are as discreet as possible.

In the present invention, the resistive switching material comprises one or more layers comprising one or more doped and/or un-doped particulate strontium titanate nanocubes according to the present invention. These particulate strontium titanate nanocubes may be semi-crystalline and/or crystalline materials. It is preferred that they are crystalline.

Un-doped strontium titanate nanocubes are essentially pure materials that have been manufactured to provide as best as possible a pure particulate form of the titanate. These may comprise impurities or components from the synthesis method used. In the case of crystalline strontium titanate nanocubes, the crystal lattice structure does not include any other materials other than the elements strontium or titanium or oxygen.

Doped strontium titanate nanocubes may be manufactured in the presence of another dopant materials that may in part be incorporated into the structure of the strontium titanate nanocubes.

Thus, in a further aspect in any or all of the previous aspects the strontium titanate may be a doped strontium titanate. The dopant may be iron or lanthanum.

The strontium titanate nanocubes have a cubic based morphology and most preferably are face-to-face square cubic and preferably have a particle size of 100 nm or less. Preferably, they are from 1 to 100 nm, more preferably from 1 nm to 50 nm in size, more preferably from 1 nm to 30 nm in size, most preferably from 5 to 25 nm in size as defined by the longest dimension of the particle.

The resistive switching material comprising strontium titanate nanocubes may consist of and preferably does consist of more than a 2D monolayer of particles. The preferred deposition techniques of the present invention are solution or liquid dispersion-based techniques, and these will often result in multiple layers of the strontium titanate nanocubes being deposited at each coating or printing step. Typically, each deposition step produces a strontium titanate nanocube layer with three or more sub-layers. Thus, for example a resistive switching material as defined in the present invention may have been prepared for example from cumulative depositions from a liquid suspension of strontium titanate nanocubes of a singular composition. Therefore, it should be understood that although the resistive switchable material, from a materials perspective, is a uniform stack of 2D layers, the staged deposition of the switchable layer may result in distinct "coating" layers in addition to the identifiable 2D particle layers. This the final resistive switching material region within a memory unit may exhibit three distinct properties; the first defined by its overall composition and structure (e.g. thickness), the second by the nature and number of distinct "coating" layers and the third by the nature of the individual 2D particle layers or sub-layers. It should be understood that the switching layer may therefore comprise a number of sub-layers of different type that may not be visible under normal analytical techniques (e.g. microscopic) but which may have a positive impact on the performance of the memory device.

Given any desired thickness for the resistive switching material this layered material may comprise any number of 2D strontium titanate nanocube layers depending on the particle size. Thus, for example the switching layer may comprise 1 to 50 or more, 2D particle layers stacked one upon the other. When there is more than one switching layer present and/or there are other metal oxide particle layers of different composition or form (e.g. particle shape) and function to the switching layer, these may have similar layer sub-structures, with their final 3D layer comprising a plurality of 2D particle layers stacked one upon the other.

The deposition processes used in the present invention along with particle selection results in the formation of these ordered structures. The deposition methods result in a form of self-assembly in each layer, where particles are deposited and under the process conditions align with each other to form ordered 2D layers of particles. It is believed that the that this self-assembly of the un-doped or doped particles and in particular nanocube particles is facilitated by intermolecular forces, for example, van der Waals forces and other forces, and the surfactant-mediated surface hydrophobicity of the liquid medium (e.g. a suitable organic solvent and a suitable surfactant) in which the un-doped or doped nanocubes are dispersed during preparation. As a result, each cube aligns itself relative to other cubes to form a near close packed like array facilitating even and proportional spacing between adjacent nanocubes. The cubic structure in nanometre scale and narrow size dispersion are preferable to form highly coordinated arrays that can be packed closely for data storage. The ultra-small dimension of un-doped and doped nanocubes and intermolecular forces, for example van der Waals, forces between the nanocubes may allow the layers to be flexible and/or when deposited on the appropriate substrates stretchable (for example the layer may follow the curvature of a curved object or expand when the substrate is elastic and is elongated). The distinct geometry of un-doped and doped nanocubes is also believed to be responsible for the enhanced multilevel endurance stability and also excellent non-volatile behaviors yielding a high on/off ratio in the memory devices of the present invention. It is also envisaged in the present invention that 2D layers may have a non-uniform arrangement, packing of the nanocubes and that there may be present localized regions of close packed or near close packed arrays interspersed between regions where there is some level of alignment of the nanocubes but they are not in close packed arrays.

Within a resistive switching material, each coating layer or layer or sub-layer may have the same thickness or have different thicknesses. As indicated above these layer thicknesses will be controlled by and dependent upon the number of deposition steps in the manufacturing process, the particle sizes used, and the number of sub-layers deposited at each stage. Generally, particle-based layers may have a thickness that is linked to the size of the nano particles used in its manufacture. If the layer is a 2D monolayer, then the thickness will be the dimensions of the nano particle used. Generally, particle-based layers may have a thickness of 1 nm to 2 μm, preferably from 2 nm to 2 μm. Preferably the process is controlled to provide functional layers (comprising multiple 2D strontium titanate nanocubes sub-layers of less thickness) of thickness from 10 nm to 1000 nm, more preferably 10 nm to 900 nm more preferably 10 nm to 500 nm, more preferably 30 to 400 nm, more preferably 50 to 300 nm, more 50 nm to 200 nm, and most preferably 60 to 180 nm.

BRIEF DESCRIPTION OF THE DRAWINGS

The present invention will be further illustrated with reference to the drawings, in which.

Figure 1:
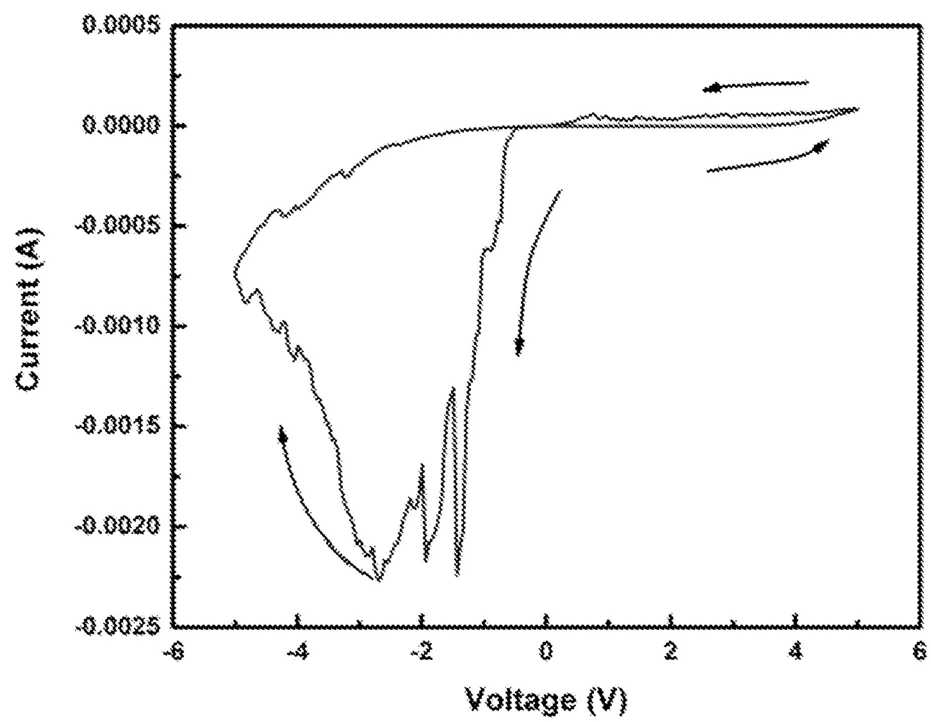
FIG. 1 Shows the I-V curve for the device of Example 1, before annealing.

The present invention will now be further illustrated by exemplification by means of the following procedures and examples.

Sample Preparation

Bottom Electrode Deposition

1. The substrate material used was typically Si/PET/FTO Glass. or other materials such as elastomeric materials and normally the dimensions of substrate are 2-2.5 cm (length)×1.5 cm (width). The used substrate is 1.5 cm (length)×1.5 cm (width).

2. At the first step electrode material e.g. metal (Au) is deposited on a substrate to provide a conductive substrate. A sputter coater (Leica sputter coater) was used to deposit bottom electrode at 40 mA for 3-4 minutes. In addition, the conductive substrates such as FTO glass, ITO coated PET and doped Si can be directly used as bottom electrode, and the electrode deposition process accordingly is avoided.

3. The electrode sputtered sample was then treated under a UV light source for at least 30 minutes prior to deposition of the strontium titanate layer.

Spin Coating:

4. A coating suspension solution is prepared using the as prepared strontium titanate sol with solvent and it is spin coated onto the substrate with bottom electrode to fabricate thin films of strontium titanate nanocubes.

5. Typically, 100 μl solution is spin coated over substrate with spin coating speed of 4000 RPM for 40 seconds unless a different staged pinning regime is used.

6. Step 5 may be repeated a number of times to provide the desired layer thickness for the nanocube film.

7. After step 6, the sample was treated in an oven to dry. After treatment at 160° C. for 1 h, no obvious liquid residue is observed in the sample.

8. After step 7 the sample was annealed at 450° C. for 1 hour. The sample was heated at a rate of 5° C./min up to 450° C. and then the furnace was allowed to cool to room temperature.

Top Electrode Deposition

1. In order to deposit the top electrode a metal shadow mask is used to deposit circular shaped top electrode (Au/Ag) via Leica sputter coater using same conditions described in steps 2-3 for the bottom electrode. The size of electrodes varies from 50 μm to 250 μm. In addition, inkjet printing may be used to deposit top electrodes by a piezoelectric inkjet printer (Fujifilm Dimatix DMP-2831).

2. The bottom gold electrode typically has a thickness of around 50~200 nm. The top electrode typically has a thickness of around 50~300 nm. In relation to the bottom electrode this can be made from a range of different materials including, but not limited to platinum, iridium, silver, gold, copper, ITO, FTO or any combination thereof. Preferred top electrodes are silver and copper After deposition of the top electrode the device is ready to conduct testing measurements.

Testing Procedures

IV Curves

1. For basic memory testing a voltage sweep mode is first run to extract current voltage measurements. Once a discrete transition from a conductive state to another conductive state (could be low or high), depending upon current variation as compared to previous state, is observed this measurement is recorded as a conventional voltage sweep IV curve. (Test-1, T-1)

Endurance Testing

1. For the endurance test, the voltages in T-1 are considered and where jumps or declines hi current level of the sample are observed one more sweep is carried out to achieve the first transition point. After achieving this transition point constant voltage pulses are imposed (relatively small voltage to set potential) (0.1-0.5V) and width (0.01 s to 0.00015), for a number of cycles (e.g. 1000 or so). In conjunction to those pulses, the current level of the sample (device) is recorded. This current value Vs. cycles (number of pulses) will provide an endurance plot of a single state [Test-2, T-2].

2. After T-2 is completed one more sweep measurement is run to determine another current transition state which should be different from the state observed in T-2. The endurance measurements are carried out at this second current transition as described in 1. This provides a further current level Vs. cycles for a said number of cycles. [Test-3, T-3].

3. Steps 1 and 2 are repeated if more than two current transitions were observed in voltage sweep measurements (Test-1).

4. After measuring at all current levels for a given number of cycles a plot is made of all the states (current/resistance levels by calculating resistance using ohm's law) Vs. number of cycles and this plot will provide a complete detailed endurance test of a given device for a said number of cycles.

Retention Testing

1. To conduct retention test, the same sequence, as described hi points 1-4 above under Endurance Testing is run but the only difference is that the experiment is run in a way such that only one constant read pulse (with defined width) is used and the sample's response is recorded for a period of time (e.g. 4000 seconds), [Test-4, T-4].

2. After having all the current/resistance levels for a given period of time the date is re-plotted in a single graph to show that the device can sustain all states for a given period of time.

Note: The purpose of endurance and retention tests are to observe sample's response in stress atmosphere. By imposing different number of pulses its fatigue test (endurance) is determined and by imposing a constant pulse for a longer period its retention (ability to sustain its data or information for longer time) is determined.

Example 1—Prior Art

The general procedure as described by Yanan Hao, et. al. (Highly dispersed SrTiO3 nanocubes from rapid sol-precipitation method, Nanoscale, 2014, 6, 7940) was used to prepare a dispersion of strontium titanate nanocubes A strontium titanate sol was synthesized as follows:

To 40 mL of TEG solvent (Triethylene-glycol, 99 wt %, Sigma) was added 16 mmol $Sr(OH)_2 8H_2O$ (95% Sigma), 16 mmol $Ti(OBu)_4$ (97 wt %, Sigma) 8 mL $NH_4OH$ (30%, AR, Chem-supply) and 0.74 g PVP (Mw~55,000 $g \cdot mol^{-1}$ Aldrich Code 56568) to form a mixture. The obtained mixture was heated to 160° C., over 30 mins and maintained at that temperature for 2 hours with stirring. After 2 hours the reaction mixture was allowed to cool under ambient conditions before being used further.

A coating dispersion was prepared by taking the reaction mixture and diluting it with ethanol in a weight ratio of 1:1 solvent:reaction mixture.

A device was manufactured by spin coating a 100 ul coating dispersion solution onto an FTO substrate at 4000 rpm for 40 seconds. After annealing at 160° C. for 1 h or 450° C. for 1 h (5° C./min to 450° C. and furnace cooled to room temperature), silver electrodes were printed onto the sample by inkjet printing. The device was further dried at 150° C. for 3 h.

The device was analyzed and also tested for its switching performance and these results are as indicated in FIGS. 1, 2, 3, 4 and 5.

Figure 2:
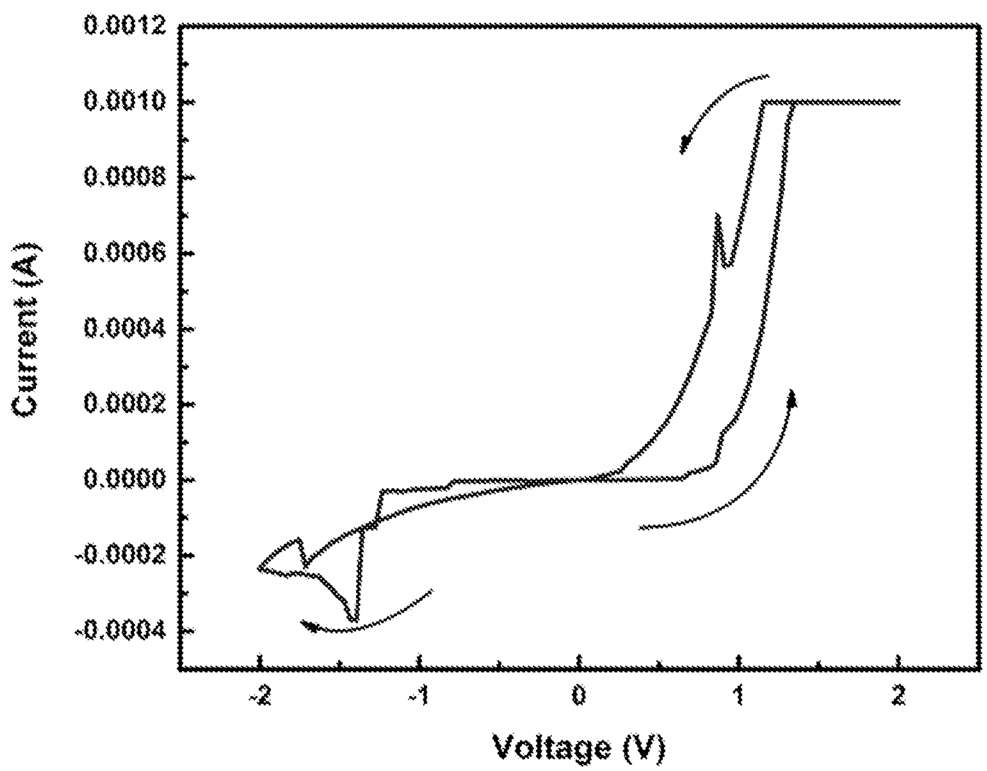
FIG. 2 Shows the I-V curve for the device of Example 1, after annealing at 450° C. for 1 hour, FIG. 3 Shows an SEM image of the device of Example 1, after annealing FIG. 4 Shows a high definition SEM image illustrating cracks in the device of Example 1 after annealing, FIG. 5 Shows a TEM of the nanocubes isolated from the reaction mixture of Example 1, via water precipitation, FIG. 6 Shows the XRD peaks for the materials of Examples 2, 3 and 4, FIG. 7 Shows a TEM of the material of Example 4, FIG. 8 FIG. 8(*a*) shows the I-V curve for the device pf Example 4 and FIG. 8(*b*) shows the retention of switching properties through switching cycles for the device of Example 4, FIG. 9. Shows the typical I-V curves for the device of Example 5

FIG. 1 shows the I-V curve for the device before annealing. This demonstrates a very weak switching performance. The device can hardly be switched during the positive sweep. FIG. 2 shows the I-V curve after annealing at 450° C. for 1 hour. The switching profile has completely changed and shows a weak switching performance. The on state is difficult to be maintained.

Figure 3:
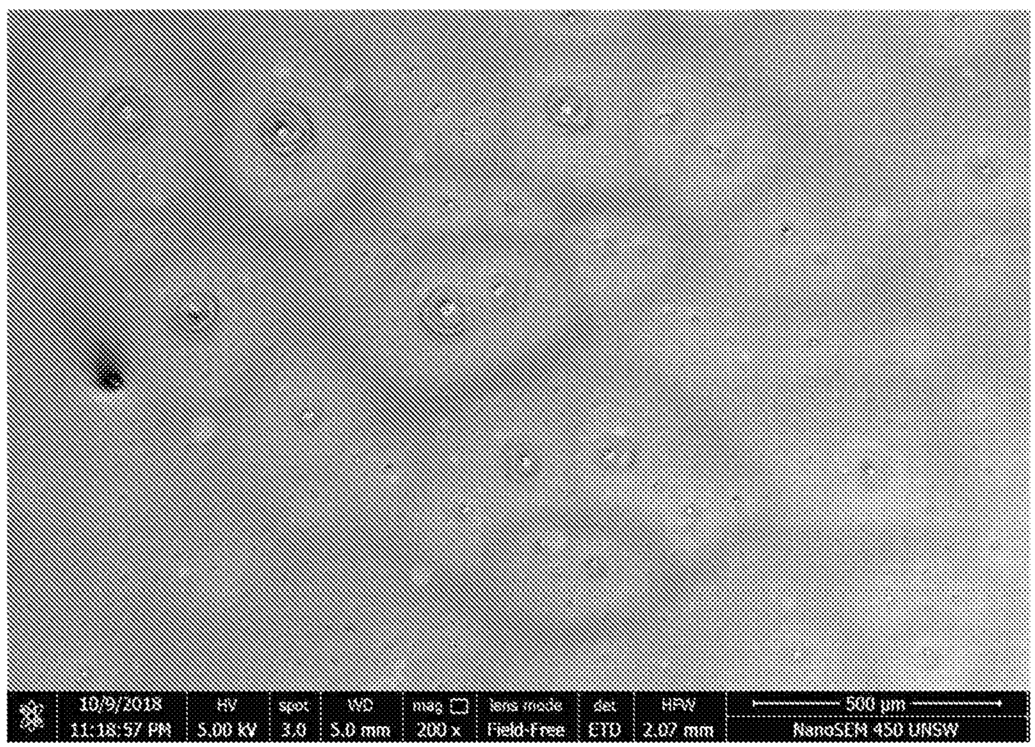
Figure 4:
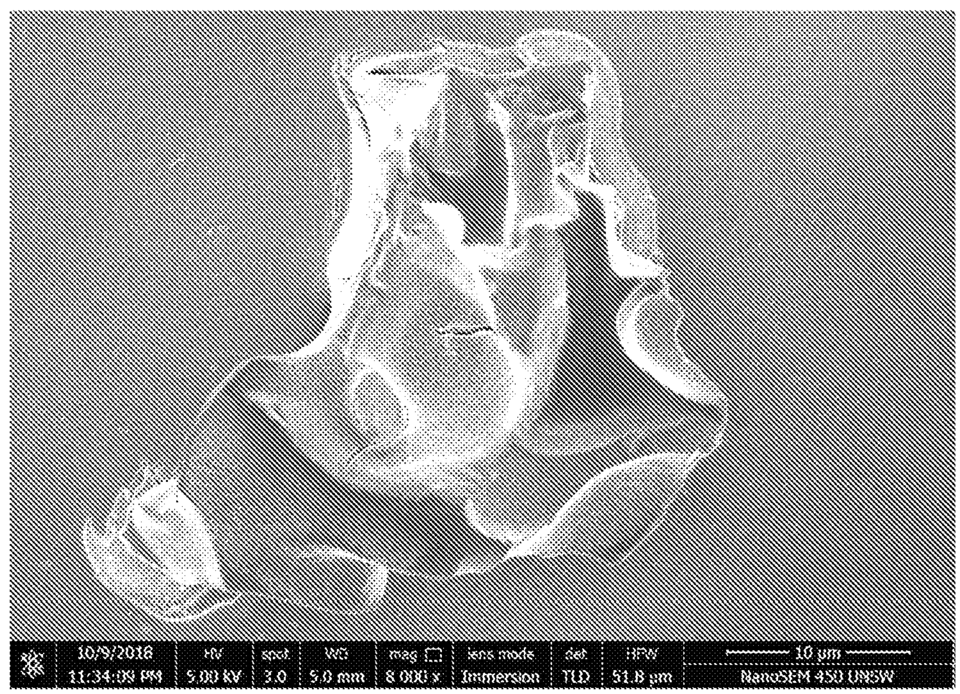

FIG. 3 shows the SEM image of the film after annealing. There are obvious significant variations in the film surface, which is not smooth and is cracked. One of these cracks is shown in FIG. 4.

Figure 5:
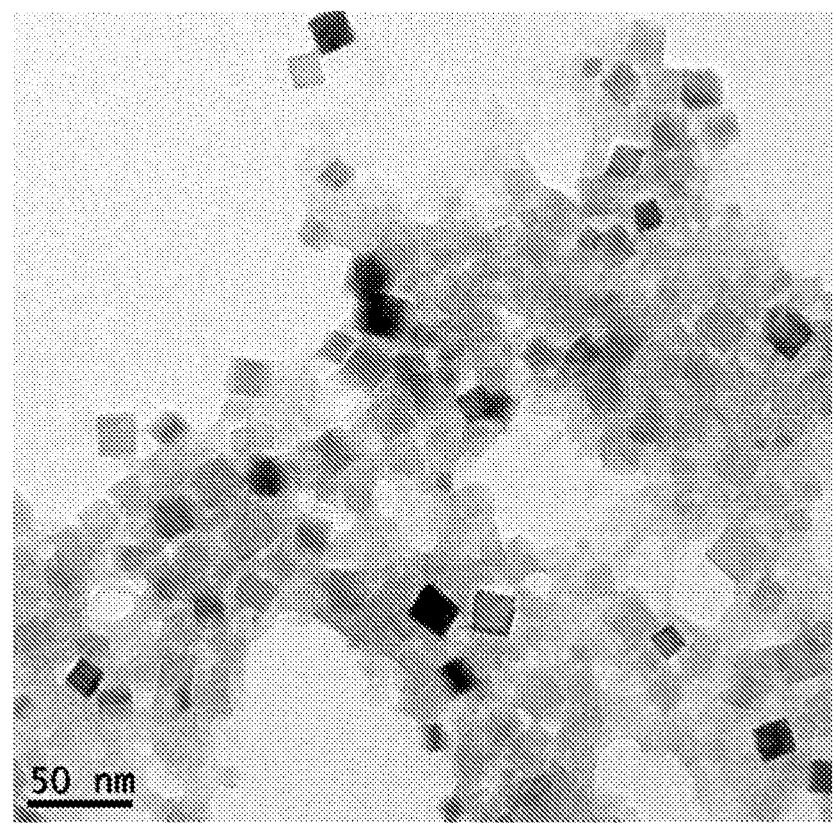

FIG. 5 is a TEM of the nanocubes isolated from the reaction mixture via water precipitation. The particles exhibit a highly variable and nonuniform morphology in which a large amount of organic material is observed.

These result show that the reaction mixture sols and materials prepared according to this Nanoscale reference do not provide suitable materials for RRAM use.

Example 2

All starting materials were purchased from Sigma and used without further purification. A strontium titanate nanocube dispersion was prepared as follows:

A 50 ml polytetrafluoroethylene reaction vessel was prepared with a polytetrafluoroethylene stirrer (500~1300 rpm). To this reaction vessel was introduced 20 mL of triethylene glycol (TEG). Then, 0.37 g of polyvinylpyrrolidone (PVP Mw 360,000 $g \cdot mol^{-1}$) was added to the TEG solution and was dissolved at 85° C. under stirring after about 30 min. Then, 8 mmol strontium hydroxide hexahydrate was added and dissolved at 85° C. under stirring after about 15 min. Then, 8 mmol $Ti(OBu)_4$ was added at 85° C. under stirring after about 10 min. Then, 5 ml of $NH_4OH$ was injected drop by drop with a 10 ml syringe. After the addition of the $NH_4OH$ was completed the reaction temperature was increased from 85° C. to 160° C. After reaction at 160° C. for 4 h, the vessel was taken out from the heater and cooled to room temperature.

The resulting reaction mixture (sol) was light yellow in colour and transparent.

Strontium titanate nanocubes were isolated from the sol by precipitation with water at a ratio of water:reaction mixture of 30:1 and separated from the supernatant by high speed centrifuge. The precipitated nanocubes were washed with water, and then washed with water and ethanol for 5 times.

Figure 6:
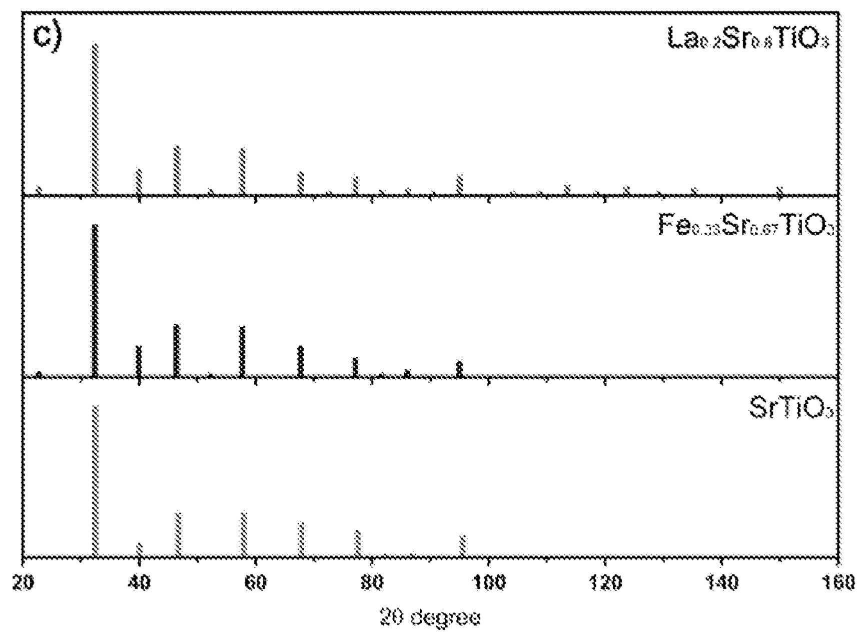

The key XRD peaks for the material are shown in FIG. 6. The XRD spectrum shows good crystallinity of STO phase in these nanocubes. TEM shows that the product is composed of uniform nanocubes.

Example 3—Lanthanum Doped

Example 2 was repeated for the preparation of a lanthanum doped strontium titanate sol and isolated nanocubes.

All materials and conditions were identical apart from the following: 25 mL of triethylene glycol (TEG) was used as solvent. 1.701 g (6.4 mmol) of strontium hydroxide hexahydrate ($Sr(OH)_2.8H_2O$) was added. 0.693 g (1.6 mmol) of lanthanum(III) nitrate hexahydrate ($La(NO_3)_3.6H_2O$ was added before the $Ti(OBu)_4$.

The XRD data for this sample is shown in FIG. 6. The XRD data indicates that no second phase is found in doped products.

Example 4—Iron Doped

Example 3 was repeated for the preparation of an iron doped strontium titanate sol and isolated nanocubes.

All materials and conditions were identical apart from the following: The lanthanum dopant was replaced with 0.647 g (1.6 mmol) of iron(III) nitrate nonahydrate ($Fe(NO_3)_3.9H_2O$).

Figure 7:
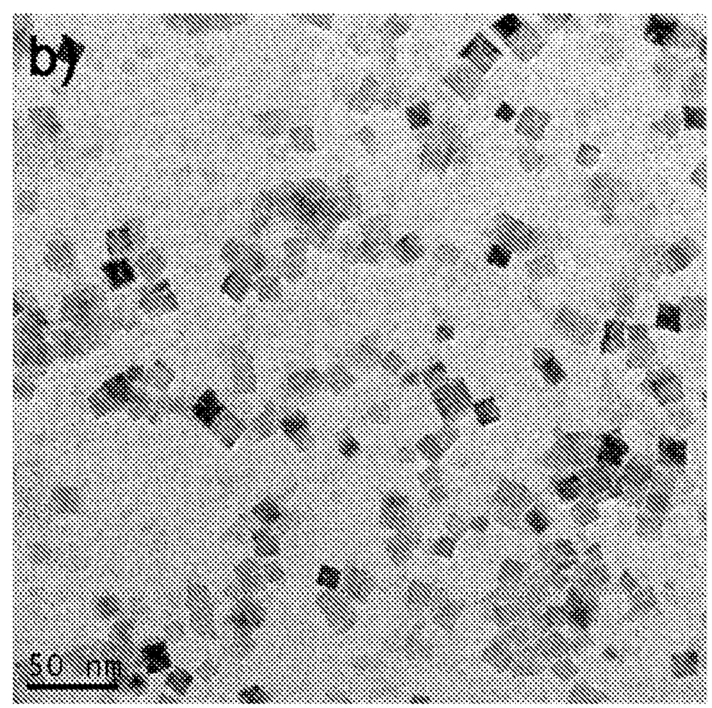

The XRD for this material is shown in FIG. 6. In addition, the TEM for this material is shown in FIG. 7.

This material was tested for its switching behavior by manufacture of a device.

Washed iron doped strontium titanate nanocubes (0.25 g) were placed into a centrifuge tube and a total of 3 mL solvents and agents (2% Oleic Acid, as agent, which can avoid the agglomeration, and toluene or ethanol as solvents).

The lips of centrifuge tubes were tightened, and these were then placed in a beaker half filed with water and sonicated with ultrasonic for 10 mins.

The samples were then centrifuged for 4 mins at 16000 rpm the supernatant layer was collected into labelled bottles. All solutions were sonicated by ultrasonic for 10 mins before coating.

For coating 20 μL of each solution was dropped onto the centre of a substrate surface. This layer was allowed to dry completely and then a further layer was deposited. A total of three layers were deposited.

Top Au electrodes were sputtered in the gold-sputtering device, covered by a 10 mm×10 mm round patterning (diameter=50 μm) shadow mask.

Figure 8:
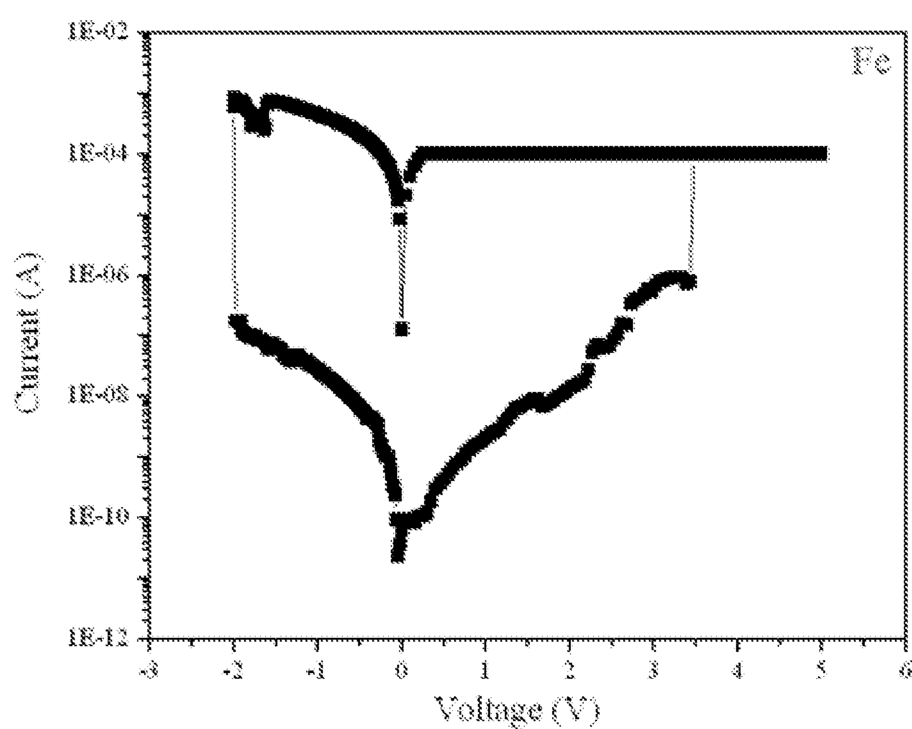
Figure 8B:
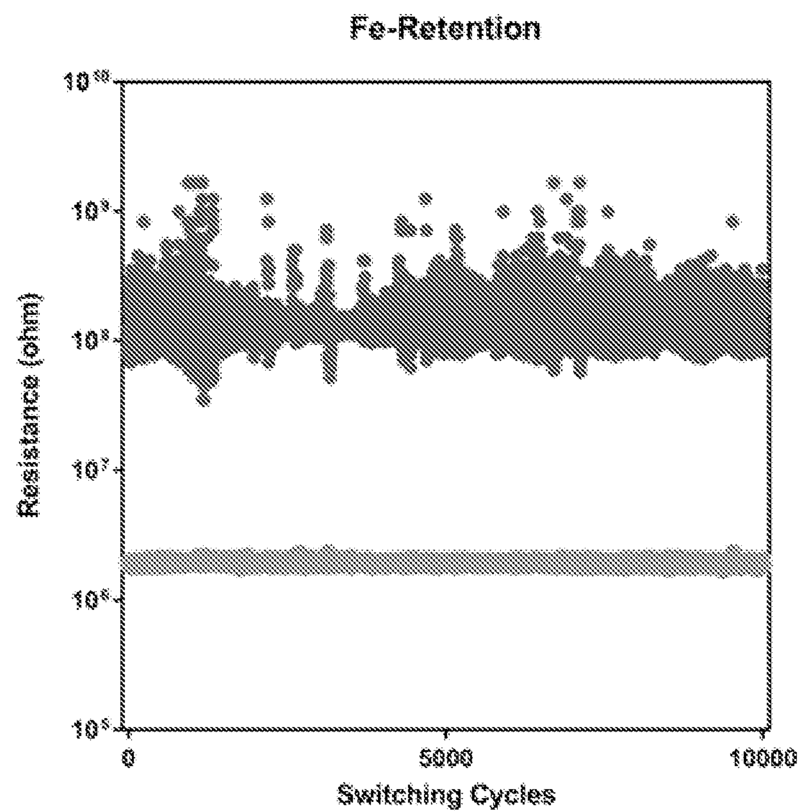

FIG. 8(*a*) shows the I-V curve for this device. FIG. 8(*b*) shows the retention of switching properties through switching cycles. The device shows stable ON/OFF ratios.

Example 5

A strontium titanate sol was prepared as Example 2.

This sol was diluted at a mass ratio of 1:1 with ethanol to produce a dispersion for spin coating. This coating dispersion (100 μl) was deposited by spin coating at 4000 rpm for 30 seconds onto FTO substrate. The substrate with the spin coated strontium titanate nanocubes was transferred to an oven and heated at 160° C. for 1 h, when no obvious liquid residue is observed in the sample. The dried strontium titanate film was then annealed by heating at 5° C./min to 450° C. and furnace cooled to room temperature.

Top electrodes of silver were deposited by inkjet printing (Fujifilm Dimatix DMP-2831) as a uniform array pattern of 400 electrode points each with a diameter of about 50 μm. The resultant device was further dried at 150° C. for 3 hours.

The sample was tested for its switching performance. The results are shown in FIGS. 9 to 12.

Figure 9:
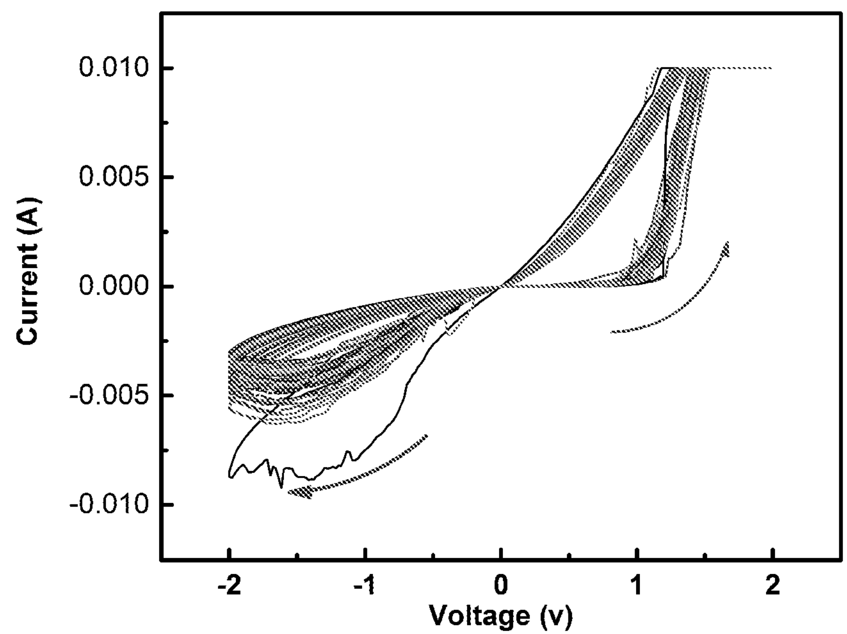

With reference to FIG. 9 the typical I-V curves for this device are shown and there is 100% performance; this means all 40 of the tested points were switchable. Small loops can be observed in the negative voltage and the device is relatively difficult to switch back to a high resistance state.

Figure 10:
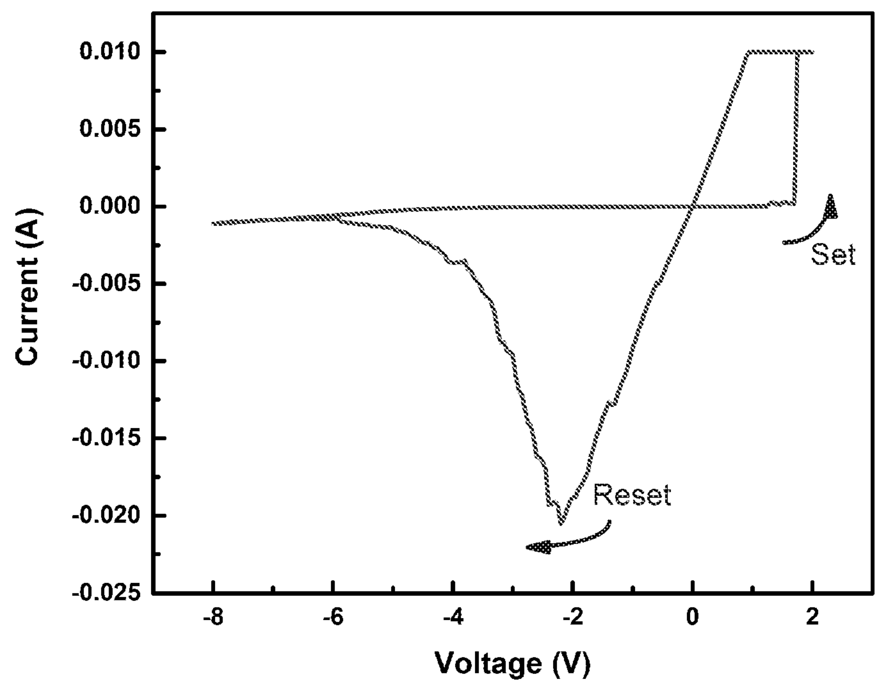
FIG. 10 Shows the switching cycle for the device of Example 5.

With reference to FIG. 10 the device can be switched on and off by applying a voltage following the sequence 0 V→2 V→0 V→-8 V→0 V. A higher negative current is normally required to switch the device back to high resistance state using negative voltage.

Figure 11:
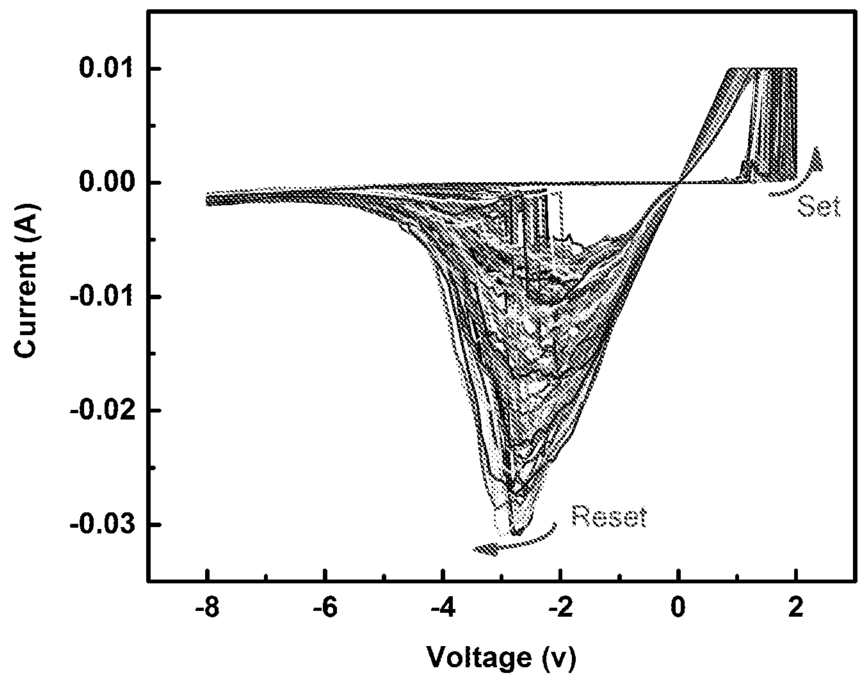
FIG. 11 Shows consecutive switching cycles for the device of Example 5.

To test the repeatability of the device, the same point on the device was successfully measured for more than 120 consecutive cycles, which can be seen in FIG. 11. The set voltage is about 1.5 to 2 V and the reset voltage is −2 to −5 V.

Figure 12:
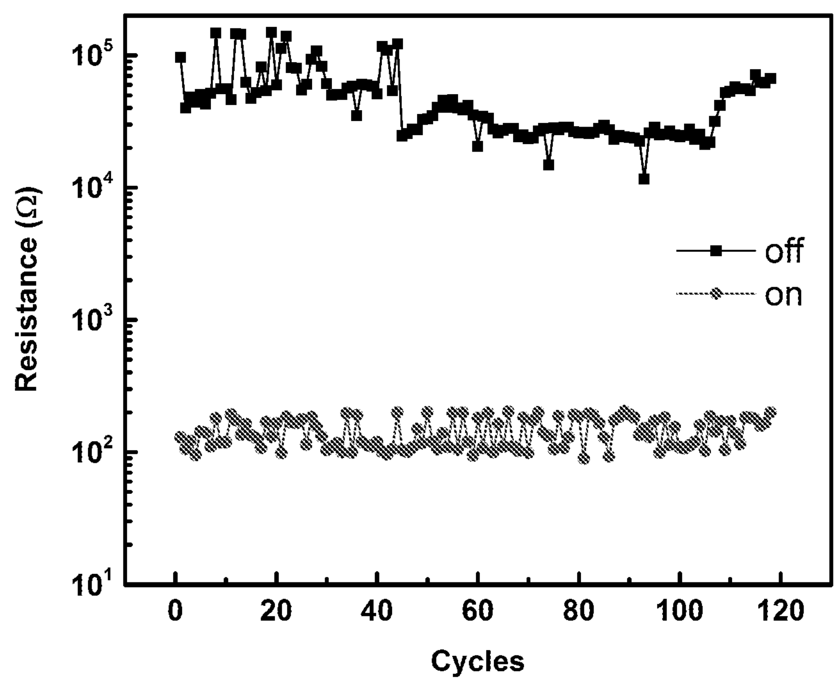
FIG. 12 Shows the endurance performance of the device of Example 5.

The endurance of the device is shown in FIG. 12 and is based in the resistances calculated by Ohm's law at 0.1 V for both high and low resistance states. As shown in the Figure, the Ron are almost kept constant with only a small variation of Roff is observed. The device exhibits and on/off ratio of >100.

The device of this example is highly stable, and the majority of the switch points can be switched on by applying a voltage of between 1-2 V. The device can be switched off by using higher negative voltages.

Example 6

Sample Reference—01(FTO)E3

A sample of strontium titanate nanocube dispersion was prepared and tested as follows:

Device Fabrication Processes

A. Substrate Preparation

1. In this example, a conductive substrate, FTO coated glass (25.4 mm (length)×25.4 mm (width)) was used and because of its properties FTO can be directly used as he bottom electrode, and further bottom electrode deposition process is accordingly avoided.

2. The substrate was ultrasonically cleaned with a standard regiment of de-ionised water with 5% concentration of deconex FPD-211 (Borer Chemie AG) and rinsed twice with de-ionised water, isopropyl alcohol (Aldrich), de-ionised water and isopropyl alcohol followed by drying with nitrogen gas (Entergris Wafergard GN Gas Filter Gun) until surface is visually dry. A UV-ozone treatment (Novascan) for 15 minutes was conducted prior to the spin coating.

B. Spin Coating

1. A coating suspension solution was prepared using the as prepared strontium titanate sol of Example 2. A strontium titanate solution (1:1 w:w in ethanol) was used to fabricate a RRAM device.

2. The strontium titanate solution was sonicated for 40 minutes prior to use.

3. After sonication, the strontium titanate solution was placed into a syringe. The solution (appox 0.5 mL) was dispensed from the syringe, without filtering, in an 'S' sequence onto a stationary substrate (FTO). The dispensed solution was left standing to wet the substrate for 60 s before initiating a spin-coat sequence using a Laurell/Model: WAS-650.

4. The spin coating parameters were:

i) Ramp=300 rpm for 5 s;

ii) Spin=4000 rpm for 30 s;

iii) Slow=1000 rpm for 10 s.

5. Prior to drying of the strontium titanate coated substrate on a hotplate, the edges of the substrate were carefully wiped with a cleanroom tissue (BEMCOT S-2) to expose the bottom transparent conducting oxide (TCO) electrode.

6. The strontium titanate coated substrate was then transferred to a hotplate for drying at 160° C. for approximately 10 min duration (Hotplate model: IKA HCT).

7. The dried strontium titanate coated substrate is then annealed. It was transferred to a programmable enclosed high-temperature hotplate (Detlef Gestigkeit Electritechnik/Model: PR 5-3T) for additional annealing at 450° C. for 60 min. The temperature ramp rate is 5° C. per min (equates to approximately 90 min. to raise the temperature from room temperature to the target temperature of 450° C. Total annealing time sequence exceeds 4 hours). The process in full requires approximately 90 minutes to reach the target temperature of 450° C., the sample is held at this temperature for a further 60 minutes and then is allowed to cool from this annealing temperature to ambient temperature or handling temperature within the furnace and this takes a minimum of 90 minutes.

8. The thickness for the strontium titanate coating on the FTO substrate was analysed by surface profilometry. The strontium titanate film thickness is consistent with an approximate thickness of between 80-90 nm.

C. Top Electrode Deposition

1. In order to deposit the square shaped top electrodes, a silver (Ag) target was accumulated atop the annealed SrTiOx layer by physical vapour deposition (PVD) in a Kitano Seiki KVD OLED Evo II system (base pressure of 10^−6 Pa) using a stainless steel shadow mask to define the device area (0.1 mm×0.1 mm. A total of 36 sites (in a 6 by 6 array) were produced on the substrate.

2. After deposition of the top electrodes, the device is ready to conduct testing measurements.

Testing Procedures

IV Curves

1. For basic memory testing a voltage sweep mode is first run to extract current voltage measurements. A Semiconductor Parameter Analyser (Agilent B1500A) was used to test the electrical properties of the RRAM device. Once, a discrete transition from a conductive state to another conductive state (could be low or high), depending upon current variation as compared to previous state, is observed this measurement is recorded as a conventional voltage sweep IV curve. (Test-1, T-1)

Endurance Testing

9. For the endurance test, the voltages in T-1 are considered and where jumps or declines in current level of the sample are observed one more sweep is carried out to achieve the first transition point. After achieving this transition point constant voltage pulses are imposed (relatively small voltage to set potential) (0.1-0.5V) and width (0.01 s to 0.0001 s), for a number of cycles (e.g. 100 or so). In conjunction to those pulses, the current level of the sample (device) is recorded. This current value Vs. cycles (number of pulses) will provide an endurance plot of a single state [Test-2, T-2].

10. After T-2 is completed one more sweep measurement is run to determine another current transition state which should be different from the state observed in T-2. The endurance measurements are carried out at this second current transition as described in 1. This provides a further current level Vs. cycles for a said number of cycles. [Test-3, T-3].

11. Steps 1 and 2 are repeated if more than two current transitions were observed in voltage sweep measurements (Test-1).

12. After measuring at all current levels for a given number of cycles a plot is made of all the states (current/resistance levels by calculating resistance using ohm's law) Vs. number of cycles and this plot will provide a complete detailed endurance test of a given device for a said number of cycles.

Figure 13:
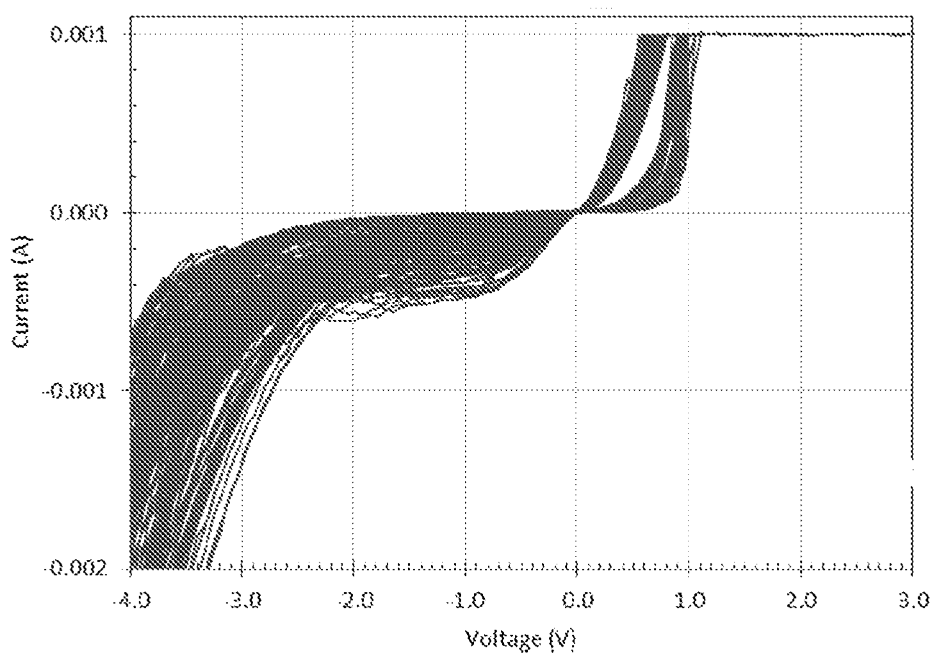
FIG. 13 Shows the complete set of 100 I-V cycles for the device of Example 6, FIG. 14 FIGS. 14(*a*) and 14(*b*) show the first 10 and last 10 I-V cycles respectively for the device of Example 6, FIG. 15 Shows the HRS and LRS values for each cycle for the device of Example 6, FIG. 16 Shows the set and reset voltages over 100 cycles for the device of Example 7, FIG. 17 Shows the HRS and LRS values over 100 cycles for the device of Example 7.
Figure 14:
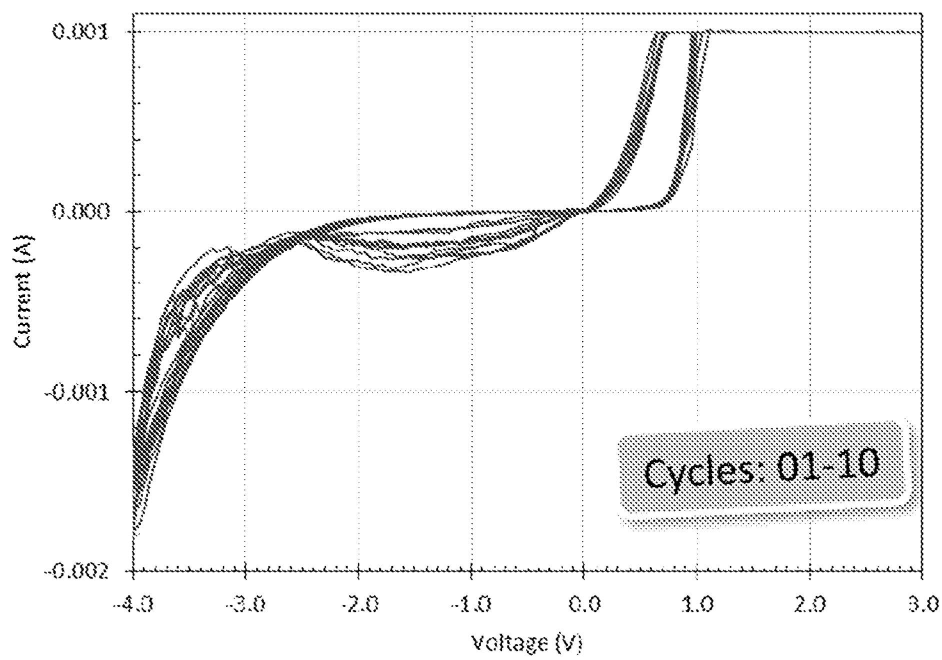
Figure 14:
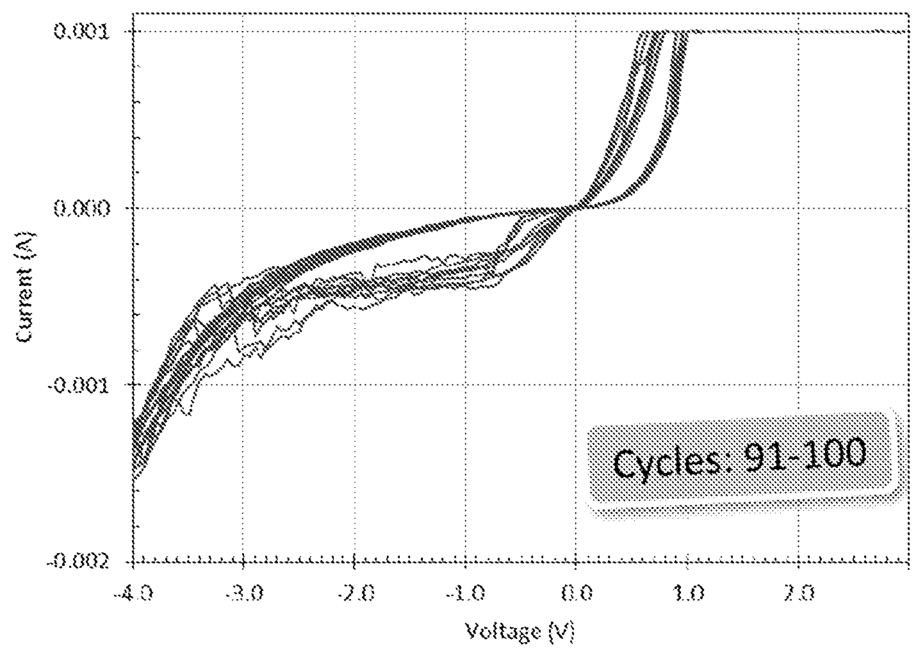
Figure 15:
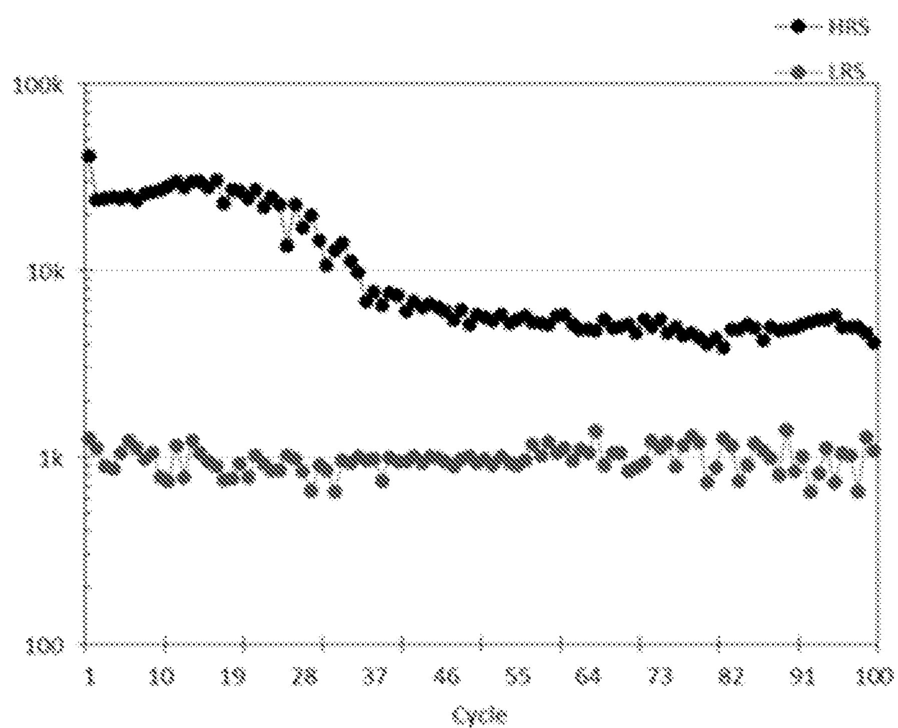

13. The device was tested through 100 I-V cycles of a device. The results are shown in FIGS. 13 to 15. FIG. 13 shows the complete set of 100 cycles, whereas FIGS. 14(*a*) and 14(*b*) show the first 10 and last 10 I-V cycles respectively. This demonstrates a degree of stability and reproducibility for this device. FIG. 15 shows the extracted HRS and LRS for each cycle. The data for these tests is summarized in Table 1 below:

TABLE 1

| Statistic | Counts | 3rd Q. | Median | 1st Q. |
|---|---|---|---|---|
| Cycles | 100 | | | |
| $V_{SET}$ (V) | 100 | 1.10 | 1.05 | 1.00 |
| $V_{RESET}$ (V) | 98 | −2.04 | −2.13 | −2.20 |
| $I_{HRS}$ (A) @ 0.5 V | 100 | 2.407E−04 | 2.305E−04 | 2.048E0.4 |

TABLE 1-continued

| Statistic | Counts | 3rd Q. | Median | 1st Q. |
|---|---|---|---|---|
| $I_{LRS}$ (A) @ 0.5 V | 98 | 6.431E−04 | 5.590E−04 | 4.153E−04 |
| $r_{OFF/ON}$ @ 0.5 V | 98 | 3.2 | 2.5 | 1.8 |

Example 7

Sample References—B001 to B004

A sample of strontium titanate nanocube dispersion was prepared as per Example 2 and tested using the same general procedures as described for Example 6.

The only differences were that the substrate was a bottom electrode of 140 nm ITO on glass and the middle spin stage for the spin coating was varied to show the impact of coating thickness on performance.

The key differences for these samples are indicated in Table 2:

TABLE 2

| Device | Bottom Electrode | Solution | RPM | Drying Temp | Annealing Temp | Top Electrode |
|---|---|---|---|---|---|---|
| B001 | 140 nm ITO | $SrTiO_3$ | 4000 | 160° C. | 450° C. | 200 nm Ag |
| B002 | 140 nm ITO | $SrTiO_3$ | 3000 | 160° C. | 450° C. | 200 nm Ag |
| B003 | 140 nm ITO | $SrTiO_3$ | 2000 | 160° C. | 450° C. | 200 nm Ag |
| B004 | 140 nm ITO | $SrTiO_3$ | 1000 | 160° C. | 450° C | 200 nm Ag |

These samples were evaluated for their I-V performance and the key results are provided in Table 3:

TABLE 3

| Device | RPM | Film Thickness nm | Tested Sites | Set [V] | Reset [V] | HRS [Ω] | LRS [Ω] | HRS/ LRS |
|---|---|---|---|---|---|---|---|---|
| B001 | 4000 | 80 | 8 | 0.70 | −0.85 | 8.7 K | 590 | ≈10 |
| B002 | 3000 | 100 | 8 | 0.90 | −0.88 | 9.5 K | 680 | ≈10 |
| B003 | 2000 | 115 | 12 | 0.95 | −0.63 | 92.5 K | 580 | ≈160 |
| B004 | 1000 | 150 | 12 | 1.00 | −0.65 | 111.9 K | 550 | ≈200 |

Figure 16:
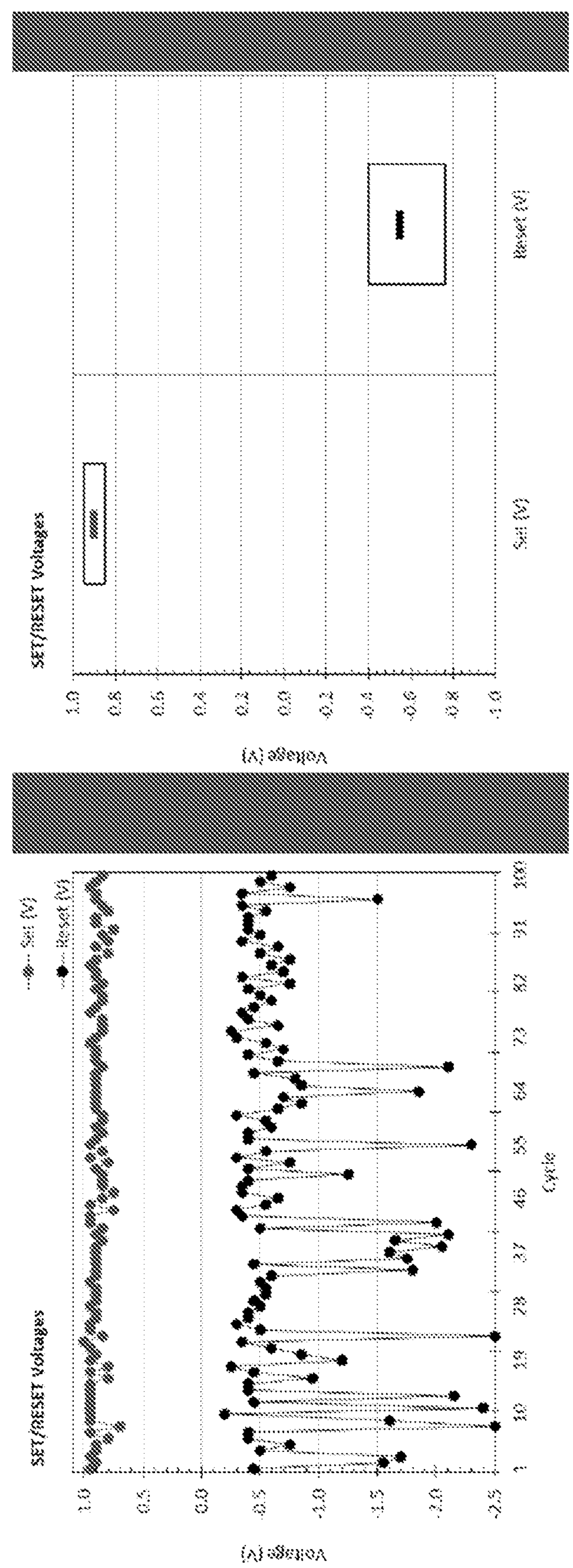
Figure 17:
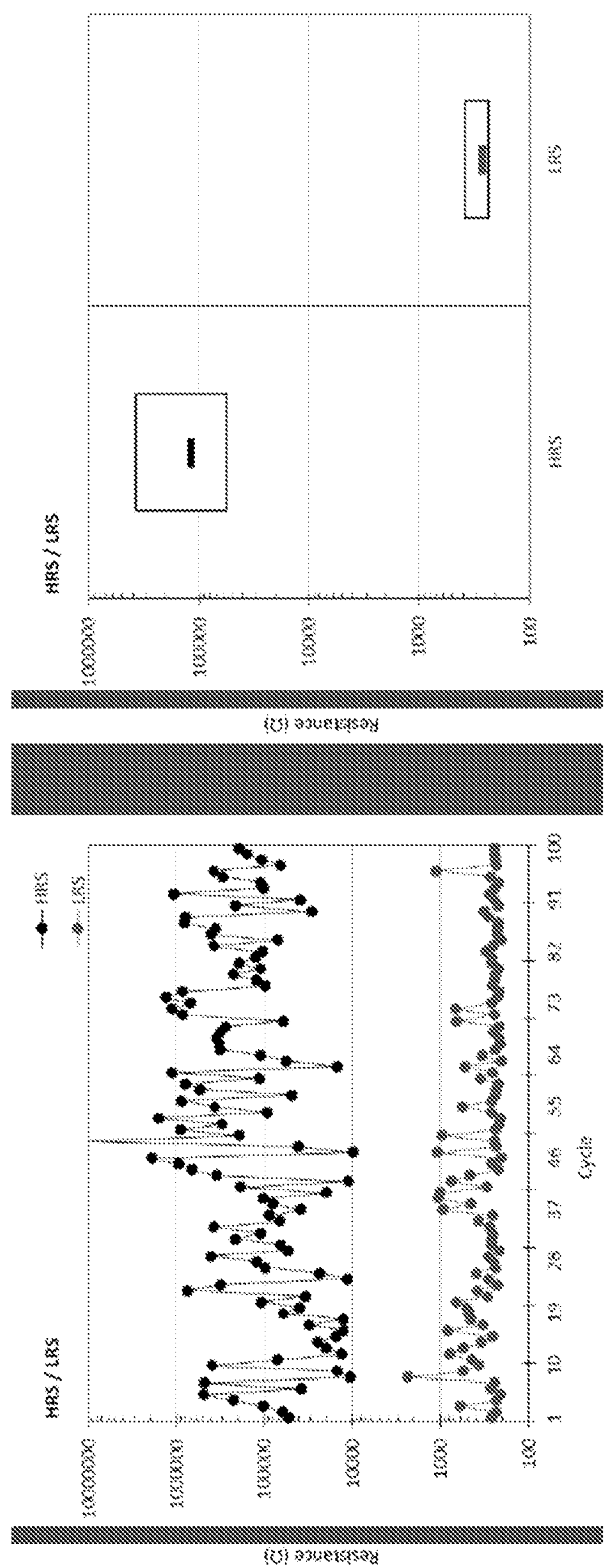

The reproducibility of the switching characteristics were evaluated over 100 cycles and the performance is shown in Table 4 and FIGS. 16 and 17 for B003 the preferred device.

TABLE 4

| Statistic | Counts | Max. | 3rd Quartile | Mean | Median | 1st Quartile | Min. |
|---|---|---|---|---|---|---|---|
| Cycles | 100 | | | | | | |
| $V_{SET}$ (V) | 100 | 1.00 | 0.95 | 0.89 | 0.90 | 0.85 | 0.70 |
| $V_{RESET}$ (V) | 100 | −0.20 | −0.40 | −0.78 | −0.55 | −0.76 | −2.50 |
| HRS (Ω) @ 0.2 V | 100 | 1.143E+07 | 3.768E+05 | 4.106E+05 | 1.176E+05 | 5.576E+04 | 9.950E+03 |
| LRS (Ω) @ 0.2 V | 100 | 2.376E+03 | 3.825E+02 | 3.824E+02 | 2.642E+02 | 2.349E+02 | 2.068E+02 |
| $r_{OFF/ON}$ @ 0.2 V | 100 | 47144.9 | 1501.2 | 1608.7 | 468.3 | 161.6 | 4.5 |

FIG. 16 shows the set and reset voltages over 100 cycles; these are relatively stable and reproducible. FIG. 17 shows the HRS and LRS stability over 100 cycles and these are both relatively stable and reproducible.

These results show that devices manufactured from this particular sol and this method of manufacture, when deposited at an RPM of 2000 or less, have very good switching performances and stability. For this particular type of sol, the thickness under these deposition conditions is greater than 100 nm. These devices with thicker layers of strontium titanate produce good quality switchable layers that have a high HRS/LRS ratio, which is desirable and is an order of magnitude greater than layers of thickness less than 100 nm. In addition, this is maintained through 100 switching cycles.

The preferred switchable layers of the present invention have a thickness of at least 100 nm and an HRS/LRS ratio of greater than 100 and have low set and reset voltages, which is highly desirable.

Example 8—Nanocube Sol Preparation

A 50 ml polytetrafluoroethylene reaction vessel was prepared with a polytetrafluoroethylene stirrer (500~1300 rpm). To this reaction vessel was introduced 20 mL of triethylene glycol (TEG).

Then, 0.37 g of polyvinylpyrrolidone (PVP Mw~360,000 $g^{-1}$ Sigma-Aldrich) was added to the TEG solution at room temperature and then this was dissolved at 85° C. under stirring after about 30 min.

Then, 8 mmol strontium hydroxide hexahydrate was added and dissolved at 85° C. under stirring after about 15 min.

Then, 8 mmol $Ti(OBu)_4$ was added at 85° C. under stirring after about 10 min.

Then, 5 ml of $NH_4OH$ was injected drop by drop with a 10 ml syringe.

After the addition of the $NH_4OH$ was completed the reaction temperature was increased from 85° C. to 160° C. After reaction at 160° C. for 6 h, the vessel was taken out from the heater and cooled to room temperature.

The resulting reaction mixture (sol) was light yellow in colour and transparent.

Example 9—Strontium Titanate Nanocube RRAM on Silicon

A RRAM device was prepared using the sol of Example 8.

The sol of Example 8 was diluted with ethanol at a mass ratio of 1:1.

Before the spin-coat process, a Si substrate (1.5 cm×1.5 cm) coated with $SiO_2$ (thickness 200±10 nm) (Zhejiang Lijing Optoelectronic Technology Co., Ltd) was cleaned with deionized water and ethanol, and then treated with ultraviolet radiation for 20 min.

The cleaned substrate was deposited wit ~100 nm Au lines (Sputter coater Leica EM ACE600) to be used as the bottom electrode.

Then 100 μl of the diluted solution was dropped onto the substrate with a 1-2 min delay before the spin coating process.

Then the solution was spin coated at the speed of 4000 rmp for 30 s.

Once spun down the thin film coated substrate was immediately transferred to an oven and heated at 100° C. for 30 min. The think film coated substrate was not subjected to a high temperature annealing stage.

Then a top surface silver line electrode with 3 layers was deposited by inkjet printing (Fujifilm Dimatix DMP-2800 inkjet printer) and further dried at 80° C. for 12 hours. Every silver layer was overlapped.

Figure 18:
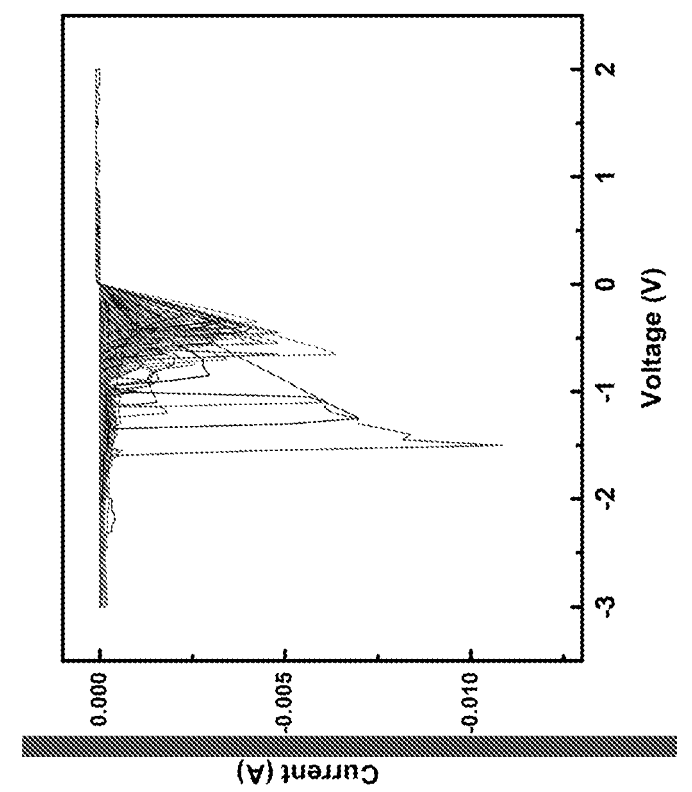
FIG. 18 Shows 500 I-V cycles for the device of Example 9, between −3V and 2V with the compliance current in positive sweep of 0.1 mA, FIG. 19 Shows the retention test data of the device of Example 9, in ON and OFF status under a bias of 0.1 V (10 s interval, 10 ms holding time), FIG. 20 Shows 126 I-V cycles for the device of Example 10, between −3V and 2V with the compliance current in positive sweep of 1 mA, also shown is the first I-V cycle, FIG. 21 Shows the retention test data of the device of Example 10, in ON and OFF status under a bias of 0.05 V (10 s interval, 10 ms holding time), FIG. 22 Shows 20 I-V cycles for a test point of the device of Example 11, FIG. 23 Shows 20 individual I-V cycles for 20 as manufactured cells in the device of Example 11, FIG. 24 Shows 220 I-V cycles for a test point of the device of Example 11, FIG. 25 Shows the retention test data of the device of Example 11, in ON and OFF status, and FIG. 26 Shows 15 I-V cycles for a test point of the device of Example 12.
Figure 18:
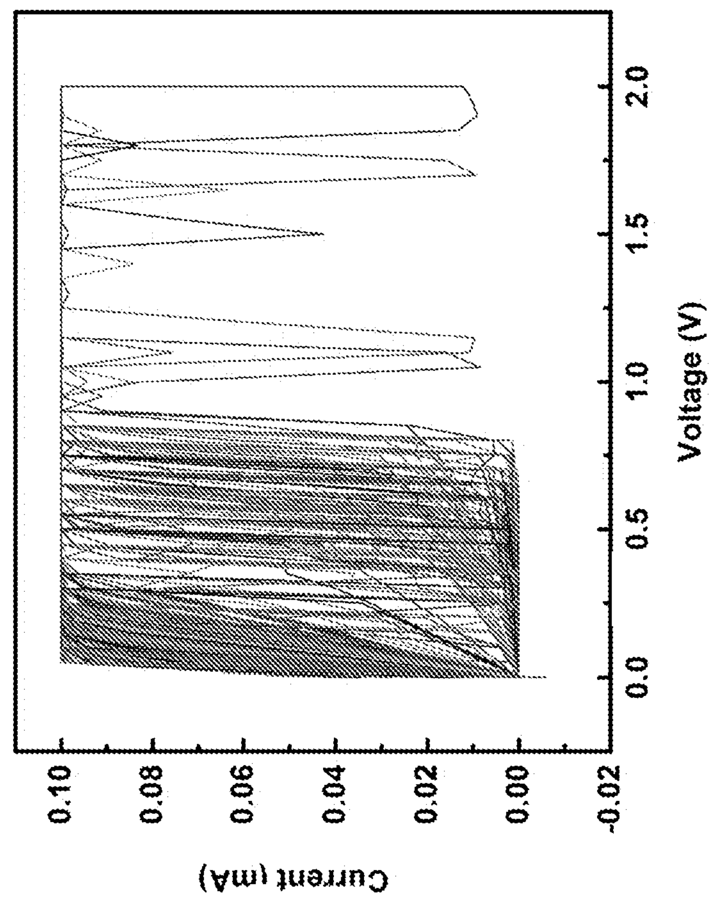
Figure 19:
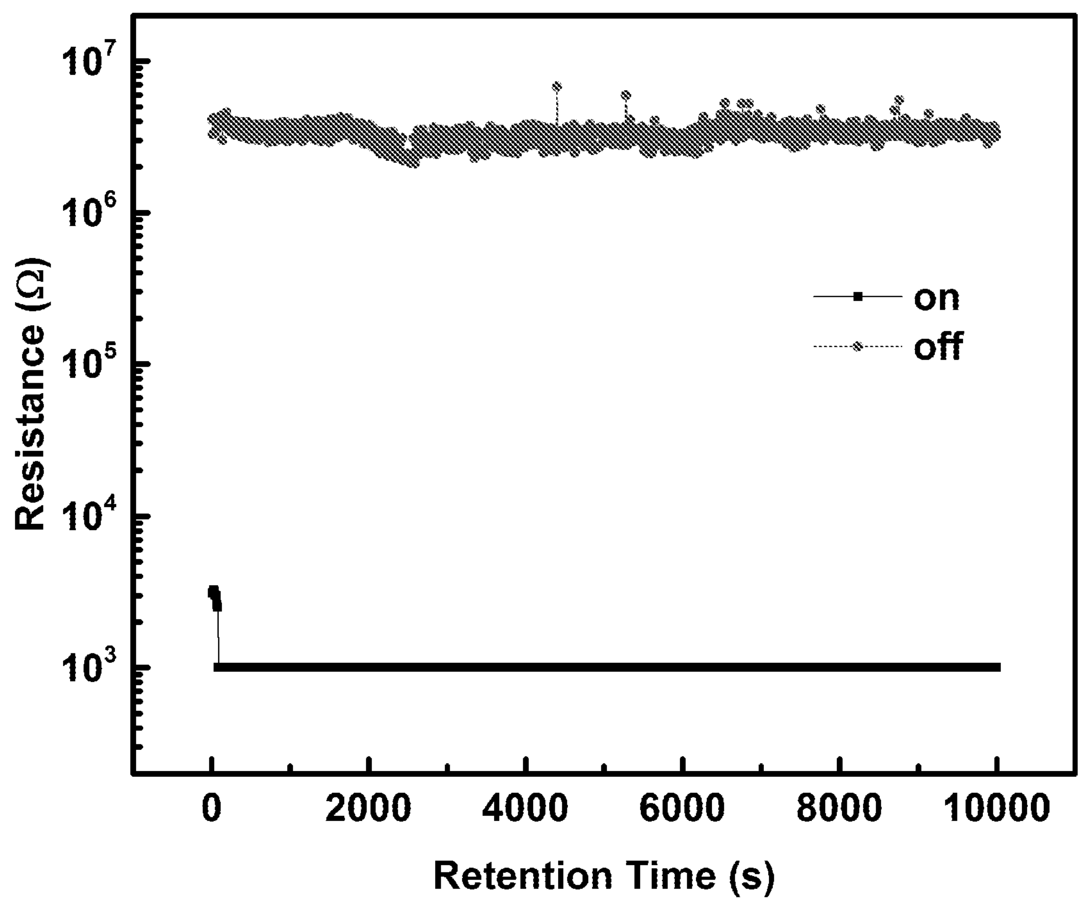

The RRAM performance of this device was evaluated, and the results are shown in FIGS. 18 and 19. In the 500 measured I-V cycles, the device showed a narrow set (0~1V) and reset voltage (0~2V). In addition, a good retention performance with a stable on and off resistance for 10000 s is demonstrated.

Example 10—Strontium Titanate Nanocube RRAM on ITO

A RRAM device was prepared using the sol of Example 8.

Before the spin-coat process, an ITO coated glass substrate (2.5 cm×2.5 cm) was cleaned with deionized water and ethanol, and then treated with ultraviolet radiation for 30 min.

Then 100 μl of the diluted solution was dropped onto the substrate with a 1-2 min delay before the spin coating process.

Then the solution was spin coated at the speed of 4000 rmp for 30 s.#

Once spun down the thin film coated substrate was immediately transferred to an oven and heated at 100° C. for 30 min. The think film coated substrate was not subjected to a high temperature annealing stage.

Ethanol was used to carefully wipe the STO film at one corner of the sample in order to expose the bottom electrode.

Then a top surface silver line electrode with 3 layers was deposited by inkjet printing (Fujifilm Dimatix DMP-2800 inkjet printer) and further dried at 80° C. for 12 hours. Every silver layer was overlapped.

Figure 20:
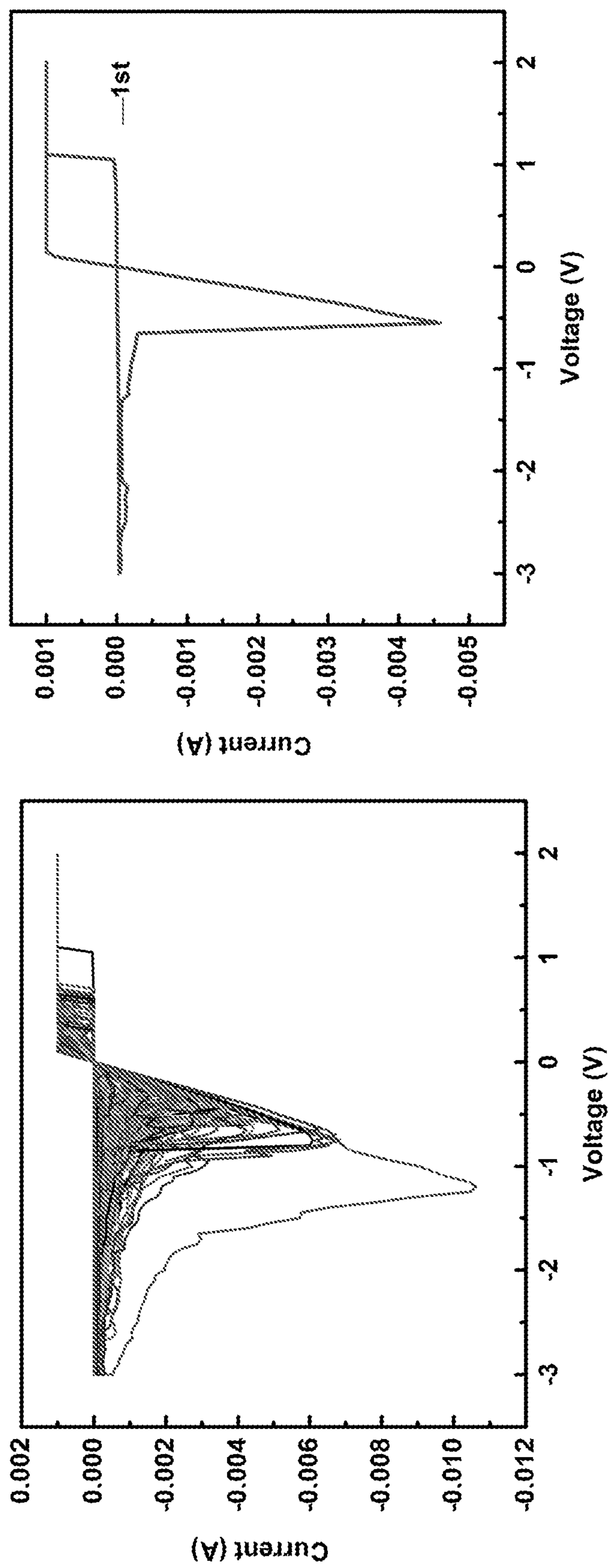
Figure 21:
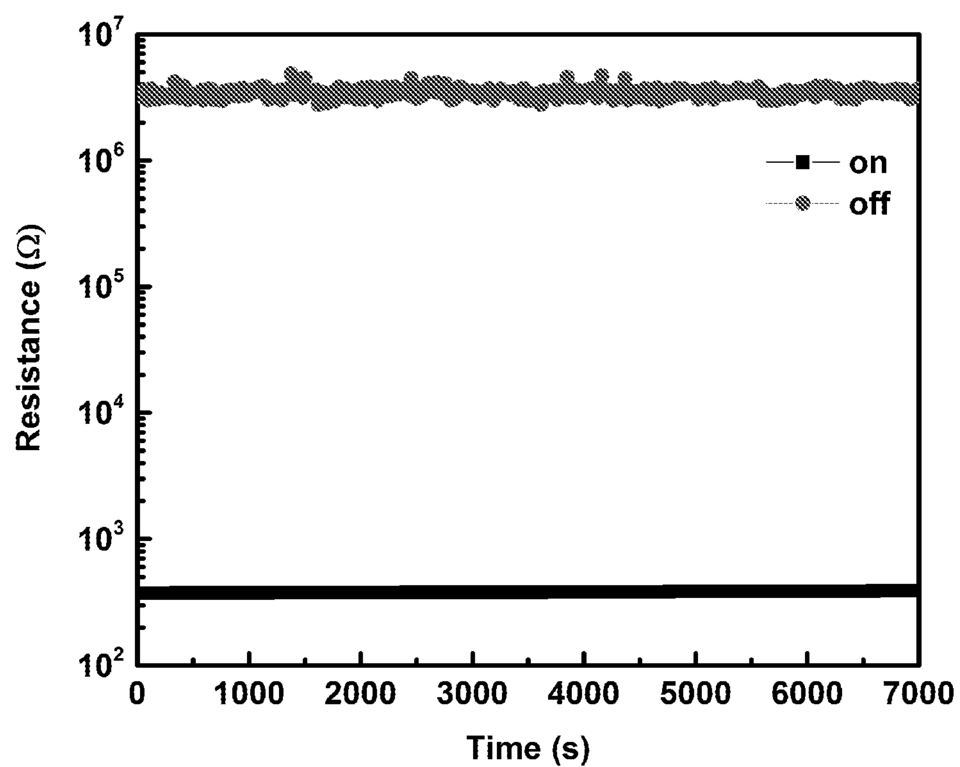
Figure 22:
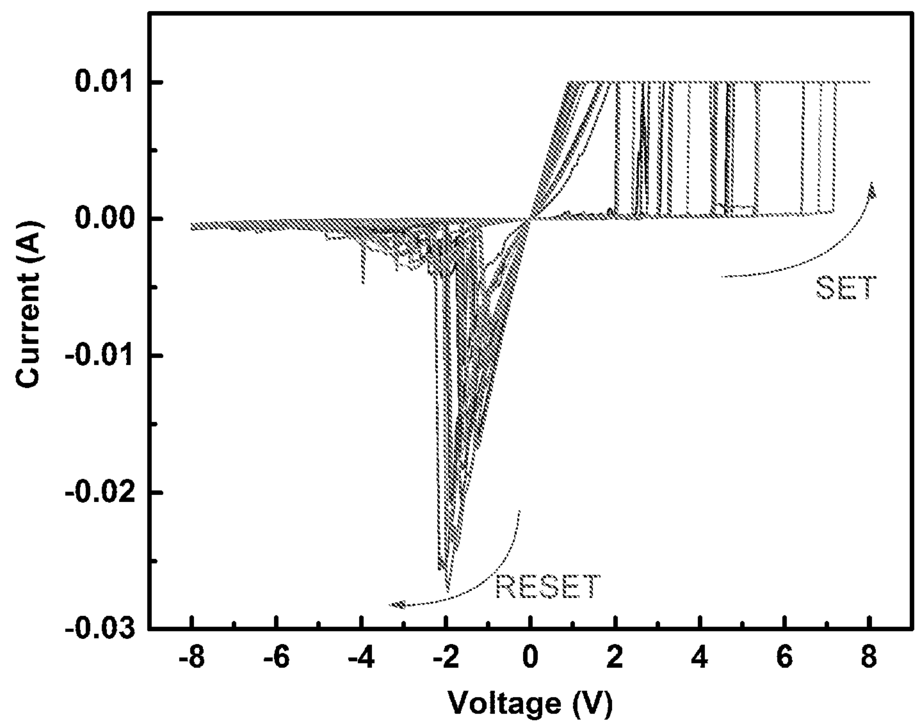
Figure 23:
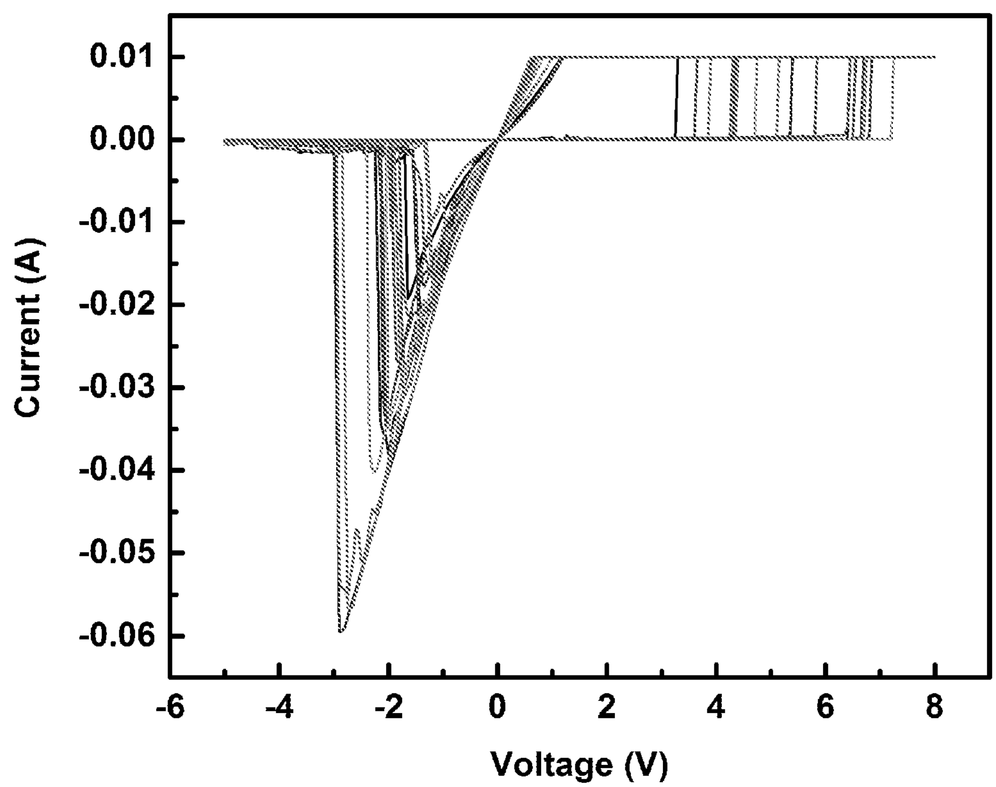
Figure 24:
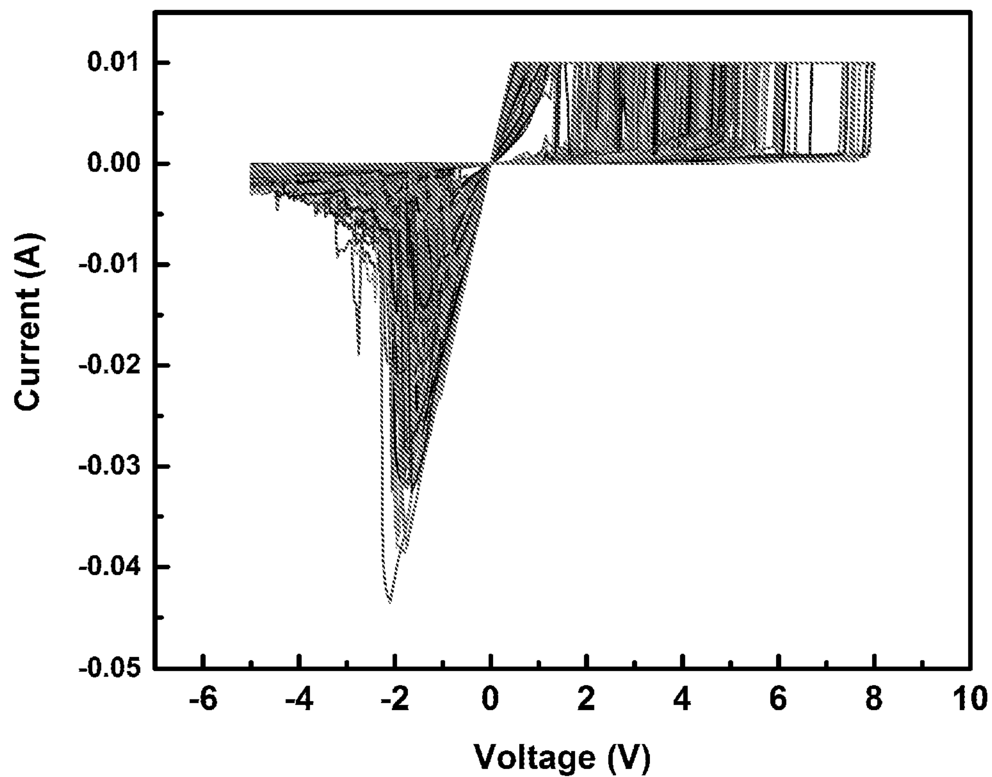
Figure 25:
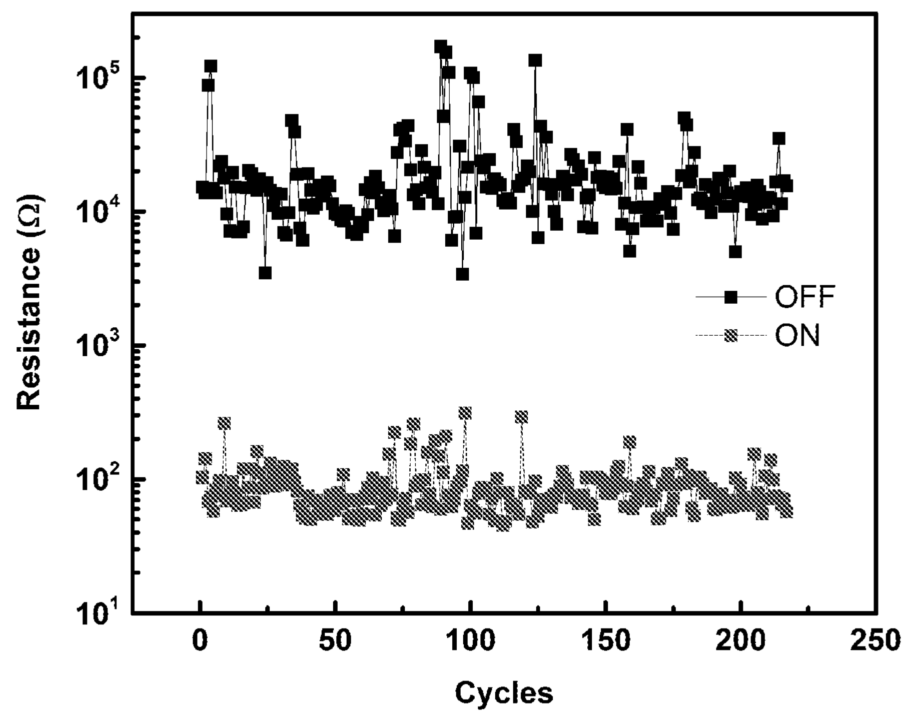

The RRAM performance of this device was evaluated and the results are shown in FIGS. 20 and 21. In the measured 126 I-V cycles, the device can be set within 1 V and reset within −3V. Additionally, the device showed nearly constant resistance for 7000 s.

Example 11—Strontium Titanate Nanocubes—Slot Die FTO Glass

The sol of Example 8 was diluted with ethanol at a mass ratio of 1:1

An FTO glass was cleaned with deionized water and ethanol, and then treated with ultraviolet radiation for 30 min.

Then the diluted solution was printed onto the clean FTO glass substrate (5 cm×5 cm) by slot-die printing. The coating speed was 15 mm/s, and the dispense rate was 10 ul/s.

After the coating was deposited it the thin film coated substrate was immediately transferred the to an oven at 100° C. for 30 min.

Ethanol was used to carefully wipe the STO film at one corner of the sample in order to expose the bottom electrode.

Then top silver electrodes with 2 and 3 layers were deposited by inkjet printing and further dried at 80° C. for 4 hours. Every silver layer was overlapped.

The RRAM performance of this device was evaluated and is shown in FIGS. 22, 23, 24 and 25. The device could be switched with voltages greater than 2 V. The device was manufactured with 20 cells and it was found that all 20 cells were operational and could be switched, which indicated a yield of 100% on manufacture.

Example 12—Strontium Titanate Nanocubes—Slot Die ITO PET Flexible Substrate

The sol of Example 8 was diluted with ethanol at a mass ratio of 1:1.

An ITO coated flexible PET substrate was cleaned with deionized water and ethanol, and then treated with ultraviolet radiation for 30 min.

Then the diluted solution was printed onto the clean ITO coated flexible PET substrate (5 cm×5 cm) by slot-die printing. The coating speed was 15 mm/s, and the dispense rate was 10 ul/s.

After the coating was deposited it the thin film coated substrate was immediately transferred the to an oven at 100° C. for 30 min.

Ethanol was used to carefully wipe the STO film at one corner of the sample in order to expose the bottom electrode.

Then top silver electrodes with 2 and 3 layers were deposited by inkjet printing and further dried at 80° C. for 4 hours. Every silver layer was overlapped.

Figure 26:
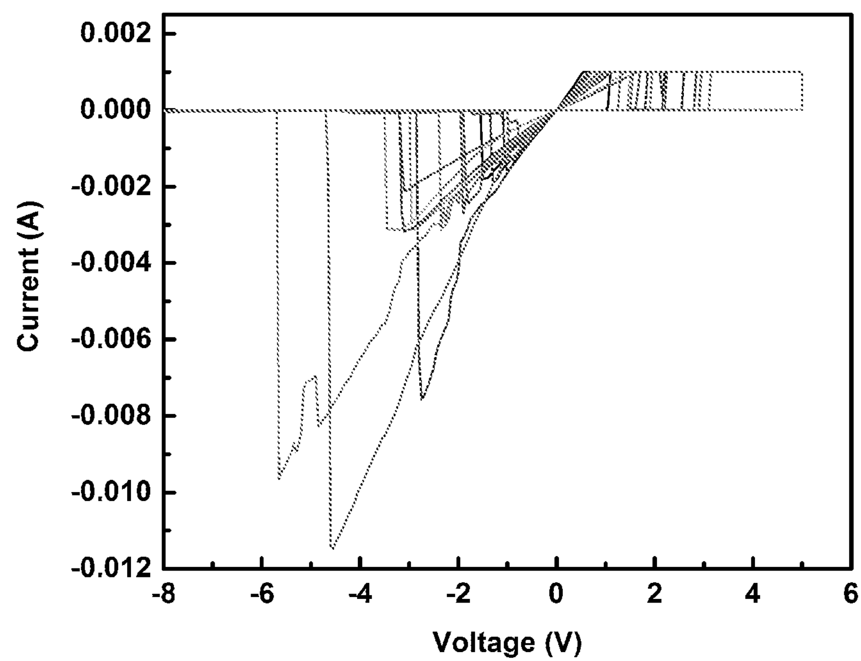

The RRAM performance of this device was evaluated and is shown in FIG. 26.

All of the features disclosed in this specification for each and every embodiment (including any accompanying claims, abstract and drawings), and/or all of the steps of any method or process so disclosed, may be combined in any combination, except combinations where at least some of such features and/or steps are mutually exclusive.

Throughout the description and claims of this specification, the words "comprise" and "contain" and variations of the words, for example "comprising" and "comprises", means "including but not limited to", and is not intended to (and does not) exclude other components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise. Features, integers, characteristics, compounds described in conjunction with a particular aspect, embodiment or example of the invention are to be understood to be applicable to any other aspect, embodiment or example described herein unless incompatible therewith. Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention claimed is:

1. A metal oxide layer for a Resistive Random Access Memory (RAM) device, the metal oxide layer comprising strontium titanate nanocubes and polyvinylpyrrolidone (PVP) surfactant having a molecular weight of greater than 80,000 $g \cdot mol^{-1}$.

2. A metal oxide layer according to claim 1, further comprising glycol solvent residue and/or carbonaceous deposits.

3. A metal oxide layer according to claim 1, wherein the metal oxide layer has a High Resistance State (HRS)/Low Resistance State ratio of at least 100.

4. A metal oxide layer according to claim 1, wherein the metal oxide layer has a stable set and reset voltage of 2 volts or less.

5. An electronics or Resistive RAM device comprising one or more metal oxide layers according to claim 1, wherein the device has an HRS/LRS ratio of at least 100.

6. A metal oxide layer according to claim 1, wherein the PVP surfactant has a molecular weight of 100,000 g·mol−1 or greater.

7. A metal oxide layer according to claim 1, wherein the PVP surfactant has a molecular weight of 200,000 g·mol−1 or greater.

8. A metal oxide layer according to claim 1, wherein the PVP surfactant has a molecular weight of 300,000 g·mol−1 or greater.

9. A method for synthesis of a strontium titanate nanocube dispersion for fabrication of the metal oxide layer according to claim 1, the method comprising:

preparing a mixture comprising a source of strontium, a source of titanium, a source of hydroxyl ion, a polyvinylpyrrolidone (PVP) surfactant and organic solvent; and heating the mixture under ambient pressure with stirring to a temperature and for a time sufficient to induce hydrolysis and formation of dispersed strontium titanate nanocubes, wherein the PVP surfactant has a molecular weight of greater than 80,000 $g \cdot mol^{-1}$.

10. A method according to claim 9, wherein the source of hydroxyl ion is added to the mixture of other components dropwise with stirring before commencement of thermal hydrolysis.

11. A method according to claim 9, wherein the temperature of the heating ranges between 150° C. and 200° C. over a period of greater than two hours.

12. A method according to claim 11, wherein the mixture is heated up to the temperature over a period of three hours or greater.

13. A method according to claim 9, wherein the source of hydroxyl ion is $NH_4OH$.

14. A method according to claim 9, wherein the source of hydroxyl ion is not organic.

15. A method according to claim 9, wherein the solvents is an oxygenated solvents.

16. A method according to claim 15, wherein the solvent is one or more solvents selected from alcohols, glycol ethers, methyl acetate, ethyl acetate, ketones, esters, glycol ether/ester derivatives, and combinations thereof.

17. A method according to claim 15, wherein the solvents is a glycols of ethylene or propylene.

18. A method according to claim 17, wherein the solvent is tri ethylene glycol (TEG).

19. A method according to claim 9, wherein the dispersion is diluted with one or more solvents.

20. A method according to claim 9, wherein the dispersion comprises an alcohol including an ethanol and/or a glycol derivative.

* * * * *